US007867466B2

(12) United States Patent
Takeuchi et al.

(10) Patent No.: US 7,867,466 B2
(45) Date of Patent: Jan. 11, 2011

(54) THERMALLY CONDUCTIVE, ELECTRICALLY INSULATING MATERIAL AND PRODUCTION METHOD THEREOF

(75) Inventors: Yukihisa Takeuchi, Aichi-pref. (JP); Yasumasa Hagiwara, Kariya (JP); Yuuichi Aoki, Aichi-pref. (JP); Eiichi Torigoe, Anjo (JP)

(73) Assignee: Denso Corporation, Kariya (JP)

( * ) Notice: Subject to any disclaimer, the term of this patent is extended or adjusted under 35 U.S.C. 154(b) by 307 days.

(21) Appl. No.: 11/978,503

(22) Filed: Oct. 29, 2007

(65) Prior Publication Data

US 2008/0102295 A1    May 1, 2008

(30) Foreign Application Priority Data

Oct. 30, 2006  (JP) .............................. 2006-294489
Sep. 20, 2007  (JP) .............................. 2007-243985

(51) Int. Cl.
*C01B 21/072* (2006.01)
*B32B 9/00* (2006.01)
*B32B 15/04* (2006.01)
*H01L 31/062* (2006.01)
*B05D 3/04* (2006.01)
*C30B 23/00* (2006.01)
*C04B 35/00* (2006.01)

(52) U.S. Cl. ........................ 423/412; 428/698; 428/457; 257/292; 427/377; 117/88; 501/98.4

(58) Field of Classification Search ........................ None
See application file for complete search history.

(56) References Cited

U.S. PATENT DOCUMENTS 3,419,404 A * 12/1968 Mao .......................... 501/98.4

(Continued)

FOREIGN PATENT DOCUMENTS

JP            05194048 A  *  8/1993

(Continued)

OTHER PUBLICATIONS

Translation of JP 05194048 A.*

(Continued)

*Primary Examiner*—Melvin C Mayes
*Assistant Examiner*—Guinever S Gregorio
(74) *Attorney, Agent, or Firm*—Harness, Dickey & Pierce, P.L.C.

(57) ABSTRACT

Means for a thermally conductive and electrically insulating material 1 containing an AlN crystal 150 mainly comprising AlN, and a production method thereof. In production, a molten aluminum layer is formed on an AlN substrate 11 with at least its surface comprising AlN in an atmosphere of a non-oxidizing gas, and the molten aluminum layer is then heated in an atmosphere of $N_2$ gas to form an AlN crystal 150 which mainly comprises an AlN layer 125. The means are also a thermally conductive and electrically insulating material having an AlN crystal and an Al gradient layer, and a production method thereof. In production, a heating step of forming a molten aluminum layer 15 on the AlN layer 125 and heating it in an atmosphere of $N_2$ gas is repeated at least twice or more. At this time, the amount of the $N_2$ gas dissolved in the molten aluminum layer is decreased as the heating step is repeated.

21 Claims, 20 Drawing Sheets

U.S. PATENT DOCUMENTS

| | | | |
|---|---|---|---|
| 3,551,101 A * | 12/1970 | Komeya et al. | 423/412 |
| 5,837,633 A | 11/1998 | Toriyama et al. | |
| 5,837,663 A * | 11/1998 | Nicholson et al. | 510/226 |
| 6,383,962 B1 * | 5/2002 | Obana et al. | 501/98.4 |
| 6,668,905 B1 * | 12/2003 | Kadomura et al. | 164/97 |

FOREIGN PATENT DOCUMENTS

| | | |
|---|---|---|
| JP | 09-012308 | 1/1997 |
| JP | 09-183662 | 7/1997 |
| JP | 10-265267 | 10/1998 |
| JP | 11-139814 | 5/1999 |

OTHER PUBLICATIONS

Merriam-Webster online dictionary definition of "uniform"; Sep. 9, 2010.*

Summaries of Lectures at 109th Fall Meeting of Institute of Light Metals 2005, No. 176, p. 351-352 with partial English translation, published Nov. 12, 2005.

Summaries of Lectures at Fall Meeting of Institute of Metals 2006, No. 689, p. 370 with partial English translation, published Sep. 16, 2006.

* cited by examiner

20um

THERMALLY CONDUCTIVE, ELECTRICALLY INSULATING MATERIAL AND PRODUCTION METHOD THEREOF

TECHNICAL FIELD

The present invention relates to a thermally conductive and electrically insulating material comprising an AlN crystal which mainly comprises an AlN layer, and a production method thereof.

BACKGROUND ART

An aluminum nitride (AlN) crystal is known as a material having good thermal conductivity and excellent electrical insulating properties, and is therefore is being used as an insulating material requiring thermal conductivity, i.e. a thermally conductive and electrically insulating material. Specifically, a thermally conductive and electrically insulating material is used, for example, as a heat sink of a semiconductor circuit.

As for the AlN crystal, an AlN sintered body obtained by shaping AlN particles together with an appropriate binder and firing it, has been conventionally used (see, Unexamined Japanese Patent Publication No. 10-265267).

However, the AlN crystal comprising an AlN sintered body has had a problem that thermal conductivity is insufficient. In order to enhance thermal conductivity, a technique of blending metal particles or the like having excellent thermal conductivity in the sintered body has sometimes been employed, but in this case, the insulating property is impaired.

SUMMARY OF INVENTIONS

The present invention has been achieved by taking into consideration these conventional problems, and an object of the present invention is to provide a thermally conductive and electrically insulating material which has excellent insulating properties and thermal conductivity, and a production method thereof.

A method for producing a thermally conductive and electrically insulating material containing an aluminum nitride (AlN) crystal which comprises an AlN layer mainly comprising AlN, wherein the method comprising:

a molten aluminum layer-forming step of forming a molten aluminum layer on an AlN substrate with at least a surface thereof comprising AlN in an atmosphere of non-oxidizing gas, and a reaction step of heating the molten aluminum layer in an atmosphere of $N_2$ gas to form an AlN crystal which comprises an AlN layer mainly comprising AlN.

In the first invention, the molten aluminum layer-forming step and the reaction step are performed. In the molten aluminum layer-forming step, as described above, a molten aluminum layer is formed on an AlN substrate with at least its surface comprising AlN, in an atmosphere of non-oxidizing gas. By performing the molten aluminum layer-forming step in an atmosphere of non-oxidizing gas, the molten aluminum layer can be formed while preventing production of alumina (aluminum oxide).

In the subsequent reaction step, as described above, the molten aluminum layer is heated in an atmosphere of $N_2$ gas to form an AlN crystal which comprises an AlN layer mainly comprising AlN. The reaction step is performed in an atmosphere of $N_2$ gas, and therefore, the $N_2$ gas dissolves in the molten aluminum layer, and the Al element in the molten aluminum layer reacts with the N element dissolved in the molten aluminum layer, whereby an AlN crystal can be produced.

The thermally conductive and electrically insulating material produced by the production method of the first invention can exhibit excellent thermal conductivity without impairing the insulating property originally possessed by the AlN crystal.

The reason why the thermally conductive and electrically insulating material produced by the production method of the first invention exhibits excellent thermal conductivity is considered as follows.

The AlN crystal (AlN layer) produced in the reaction step can inherit the crystal structure of the hexagonal AlN crystalline particle on the AlN substrate surface. In other words, an AlN crystal resulting from crystal grain growth in a fixed direction starting at the AlN crystalline particle on the AlN substrate surface is obtained. Therefore, a gap between crystalline particles is less produced, and an AlN crystal comprising a crystal grain having a relatively large aspect ratio can be produced. This is considered to enable the thermally conductive and electrically insulating material to exert excellent thermal conductivity.

A second invention is a thermally conductive and electrically insulating material produced by the production method of the first invention.

The thermally conductive and electrically insulating material of the second invention is produced by the production method of the first invention. This thermally conductive and electrically insulating material contains, as described above, an AlN crystal having a small gap between crystalline particles and comprising a crystal grain having a relatively large aspect ratio. This AlN crystal can exhibit not only excellent insulating property originally possessed by AlN, but also excellent thermal conductivity. Therefore, the thermally conductive and electrically insulating material can exhibit excellent thermal conductivity and excellent insulating property.

A third invention is a method for producing a thermally conductive and electrically insulating material comprising an AlN crystal which comprises an AlN layer mainly comprising AlN, and an Al gradient layer which contains Al and AlN and is formed on the AlN crystal and in which the Al concentration increases with distance from the AlN crystal in the stacking direction, the method comprising:

a molten aluminum layer-forming step of forming a molten aluminum layer on an AlN substrate with at least a surface thereof comprising AlN in an atmosphere of non-oxidizing gas, a reaction step of heating the molten aluminum layer in an atmosphere of $N_2$ gas to form an AlN crystal which comprises an AlN layer mainly comprising AlN, and a gradient step of forming the Al gradient layer by repeating at least twice or more a heating step of forming a molten aluminum layer on the formed AlN layer in an atmosphere of non-oxidizing gas, and heating the molten aluminum layer in an atmosphere of $N_2$ gas, and also by decreasing the amount of the $N_2$ gas dissolved in the molten aluminum layer as the heating step is repeated.

In the third invention, the molten aluminum layer-forming step, the reaction step and the gradient step are carried out.

The molten aluminum layer-forming step and the reaction step in the third invention are the same steps as those in the first invention, so that the above-described AlN layer comprising an AlN crystal having a small gap between crystalline particles and containing a crystal grain having a relatively large aspect ratio can be formed.

In the heating step, a molten aluminum layer is formed on the formed AlN layer in an atmosphere of non-oxidizing gas and the molten aluminum layer is heated in an atmosphere of $N_2$ gas. In other words, the molten aluminum layer can be formed on the AlN layer which has been formed on the AlN substrate, in the same manner as in the molten aluminum layer-forming step above, and the AlN layer can be further formed in the same manner as in the reaction step above.

Also, in the third invention, the gradient step of repeating the heating step twice or more is carried out. In the gradient step, the amount of the $N_2$ gas dissolved in the molten aluminum layer is decreased as the heating step is repeated. When the amount of the $N_2$ gas dissolved is decreased, the molten aluminum layer cannot satisfactorily react with the $N_2$ gas, and an AlN layer allowing for remaining of Al is formed. As the heating step is repeated, the amount of the $N_2$ gas dissolved gradually decreases, as a result, the remaining amount of Al gradually increases, whereby the Al gradient layer can be formed.

In this way, a thermally conductive and electrically insulating material comprising an AlN layer which comprises an AlN crystal mainly comprising AlN, and an Al gradient layer which contains Al and AlN and is stacked and formed on the AlN crystal, and in which the Al concentration increases with the distance from the AlN crystal in the stacking direction, can be produced.

A fourth invention is a thermally conductive and electrically insulating material produced by the method of the third invention.

The thermally conductive and electrically insulating material of the fourth invention is produced by the production method of the third invention. This thermally conductive and electrically insulating material contains an AlN crystal having a small gap between crystalline particles, and comprising a crystal grain having a relatively large aspect ratio. In other words, by virtue of the AlN crystal above, this thermally conductive and electrically insulating material can exhibit excellent insulating property and excellent thermal conductivity.

Furthermore, this thermally conductive and electrically insulating material has the above-described Al gradient layer. Therefore, in the case of joining the thermally conductive and electrically insulating material, for example, to an external heat conductor such as cooling device and heating element at the side where the Al gradient layer is formed, the thermally conductive and electrically insulating material can be joined using a metal material. In other words, by making use of the characteristic property of a metal material excellent in thermal conductivity, joining can be carried out without impairing the thermal conductivity between the thermally conductive and electrically insulating material and the heat conductor. Also, the Al gradient layer contains Al which is a metal, so that this layer can be easily bonded to the metal material for joining.

Furthermore, in the Al gradient layer, the Al concentration increases with increasing the distance from the AlN crystal, so that the difference in thermal expansion between the outermost layer of the Al gradient layer and the AlN crystal can be relieved, and in turn, the thermally conductive and electrically insulating material can be prevented from, for example, deformation or breakage due to difference in the thermal expansion between the Al gradient layer and the AlN layer.

DETAILED DESCRIPTION

Figure 1:
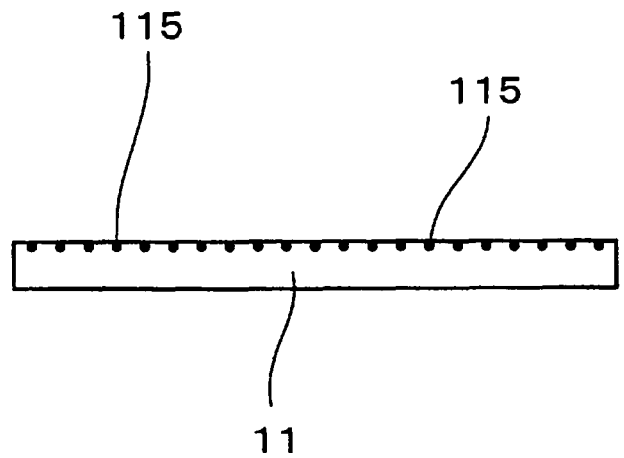
FIG. 1 shows an explanatory view illustrating the construction of the AlN substrate according to Example 1.

Preferred embodiments of the present invention are described below.

The first invention is described below.

In the molten aluminum layer-forming step of the present invention, a molten aluminum layer is formed on an AlN substrate with at least its surface comprising AlN in an atmosphere of non-oxidizing gas.

The atmosphere of non-oxidizing gas is an atmosphere of $N_2$ gas.

In this case, the molten aluminum layer-forming step can be performed in the same atmosphere of $N_2$ gas as that in the reaction step, so that the atmosphere conditions can be easily controlled. Furthermore, the $N_2$ gas can be dissolved in the molten aluminum layer also in the molten aluminum layer-forming step, so that the formation of the AlN layer can be accelerated.

The molten aluminum layer-forming step can be performed, for example, at a temperature of 650 to 1,500° C.

In the molten aluminum layer-forming step, the molten aluminum layer is preferably formed to a thickness of 0.001 to 1 mm.

If the thickness of the molten aluminum layer is less than 0.001 mm, the crystal grain in the AlN crystal formed in the reaction step may become small and the interface between crystalline particles in the crystal grain may increase to make it necessary for the heat at the heat transfer to pass many interfaces, as a result, the transfer of heat may be inhibited and the thermal conductivity may decrease. On the other hand, if the thickness exceeds 1 mm, the reaction with $N_2$ gas may not proceed in the inside of the molten aluminum layer and Al may readily remain in the AlN layer, as a result, the insulating property of the thermally conductive and electrically insulating material may decrease. The thickness of the molten aluminum layer is more preferably from 10 to 50 μm.

In the molten aluminum layer-forming step, the molten aluminum layer is formed by dropping a molten aluminum droplet on the AlN substrate and also arraying the droplets on the AlN substrate.

In this case, the molten aluminum layer can be easily produced in a uniform thickness on the AlN substrate. Also, the thickness of the molten aluminum layer can be easily controlled by adjusting the droplet size. Furthermore, in the case of performing the molten aluminum layer-forming step in an atmosphere of $N_2$ gas, the $N_2$ gas can be dissolved in the droplet until the molten aluminum droplet reaches the AlN substrate, so that the formation of the AlN layer can be accelerated.

The droplet size is preferably from 0.001 to 1 mm. If the droplet size is less than 0.001 mm, the droplets may not be easily arrayed on the AlN substrate in the molten aluminum layer-forming step. More specifically, when the molten aluminum droplets are dropped by their own weight and arrayed on the AlN substrate, the droplets may attach to the side wall or the like of the reaction vessel by the effect of airflow or the like in the reaction vessel and may not be easily arrayed on the AlN substrate. Furthermore, also in this case, as described above, the crystal grain in the AlN crystal becomes small and the heat at the heat transfer must pass many interfaces between crystal grains, and as a result the transfer of heat may be inhibited. On the other hand, if the droplet size exceeds 1 mm, when the droplets are arrayed on the AlN substrate in the molten aluminum layer-forming step, a gap may be produced between droplets and a high-density AlN layer may be difficult to form.

In the molten aluminum layer-forming step above, when the molten aluminum droplet is dropped, the droplet reacts with the surrounding $N_2$ gas until the droplet reaches the AlN substrate, and AlN is formed on at least a part of the surface thereof. At this time, the inside of the droplet still maintains the aluminum molten state, but the AlN portion on the surface is slightly cured. Particularly, when the droplet is caused to drop a long distance, the thickness of the AlN layer formed on the surface thereof becomes large. Preferably, the dropping distance and the like of droplet are controlled such that a thin AlN shell is formed during dropping and when the droplet reaches the AlN substrate, the shell is ruptured to allow the molten aluminum in the inside to flow out and form a molten aluminum layer in a uniform thickness. At this time, if the droplet size exceeds 1 mm, the amount of the AlN shell formed in the outer periphery of the molten aluminum layer may increase and when the shell is ruptured and the molten aluminum in the inside flows out, the ruptured shell may inhibit the formation of the molten aluminum layer in a uniform thickness. Also, crystal growth may randomly proceed from the AlN shell portion and this may bring bout fluctuation in the size, shape, crystal direction or the like of the crystal grain in the AlN crystal, as a result, the denseness of the AlN crystal and in turn the thermal conductivity may decrease. The droplet size is more preferably from 10 to 50 μm.

The droplet may be dropped by its own weight on the AlN substrate, for example, from a molten aluminum supply tank disposed above the AlN substrate. At this time, the molten aluminum layer can be formed in a uniform thickness on the AlN substrate by relatively moving the AlN substrate and the molten aluminum supply tank. Also, the size of the dropping droplet may be controlled by providing a droplet supplying hole capable of controlling the size and open/close speed, on the bottom of the molten aluminum supply tank.

At the time of dropping the molten aluminum droplet, the droplets are preferably supplied from a plurality of droplet supplying holes. In this case, a plurality of droplets can be dropped on the AlN substrate, so that the time until the molten aluminum layer is formed can be shortened.

The molten aluminum preferably comprises a magnesium-containing aluminum alloy.

In this case, at the formation of the molten aluminum layer in the molten aluminum layer-forming step, the oxide (alumina) formed, for example, on the surface of the molten aluminum is deprived of oxygen by the magnesium, and a molten aluminum layer with excellent reactivity can be formed. As a result, the reaction between the molten aluminum layer and nitrogen (N) readily proceeds in the reaction step, and the formation of the AlN crystal can be accelerated.

As for the aluminum alloy, an alloy containing Mg, for example, in a ratio of 10 mass % or less may be employed.

Specific examples of the aluminum alloy which can be employed include a 5000 series aluminum alloy.

In the molten aluminum layer-forming step, the molten aluminum layer is preferably formed by disposing an aluminum sheet on the AlN substrate, and melting the aluminum sheet.

In this case, the molten aluminum layer can be easily produced in a uniform thickness on the AlN substrate. Also, the thickness of the molten aluminum layer can be easily controlled by adjusting the thickness of the aluminum sheet. Furthermore, in this case, the amount of alumina (aluminum oxide) in the AlN layer can be controlled, because the aluminum sheet is oxidized only at the surface thereof.

The thickness of the aluminum sheet is preferably from 0.005 to 1 mm.

If the thickness is less than 0.005 mm, the oxide layer such as $Al_2O_3$ on the aluminum sheet surface may be caused to occupy a large ratio. In other words, an oxide layer of approximately from several nm to several tens of nm is generally formed on both surfaces of an aluminum sheet almost irrespectively of the thickness and therefore, if the thickness of the aluminum sheet is reduced, as described above, the ratio of the oxide layer increases, as a result, the oxide may remain in the AlN layer and the thermal conductivity of the AlN layer may decrease. As understood also from the fact that the thermal conductivity of AlN is from 200 to 300 W/m/K and the thermal conductivity of $Al_2O_3$ is from 10 to 20 W/m/K, it is preferred to decrease the oxide such as $Al_2O_3$ in the AlN layer.

On the other hand, if the thickness of the aluminum sheet exceeds 1 mm, the molten aluminum layer may be difficult to be formed in a thickness of 1 mm or less and in turn, as described above, it may become difficult for the AlN production reaction to satisfactorily proceed by dissolving the $N_2$ gas even into the inside of the molten aluminum layer, as a result, Al may readily remain in the AlN layer. The thickness is more preferably from 10 to 50 μm.

At the time of disposing an aluminum sheet on the AlN substrate, the temperature of the AlN substrate can be controlled.

In the case where the aluminum sheet is disposed on the AlN substrate heated to a temperature (for example, 650° C. or more) higher than the melting point of aluminum, the aluminum sheet at least partially becomes molten aluminum when put into contact with the AlN substrate, so that the molten aluminum layer can be formed on the AlN substrate while melting the aluminum sheet.

In the case where the aluminum sheet is disposed on the AlN substrate at a temperature less than the melting point of aluminum, the AlN substrate after disposing the aluminum sheet thereon is heated to a temperature higher than the melting point of aluminum, whereby the aluminum sheet can be melted and the molten aluminum layer can be formed.

The aluminum sheet preferably comprises a magnesium-containing aluminum alloy.

In this case, at the formation of the molten aluminum layer in the molten aluminum layer-forming step, the oxide (alumina) formed, for example, on the surface of the aluminum sheet is deprived of oxygen by magnesium and a molten aluminum layer with excellent reactivity can be formed, as a result, in the reaction step, the reaction between the molten aluminum layer and nitrogen (N) readily proceeds and the formation of the AlN crystal can be accelerated.

As for the aluminum alloy, an alloy containing Mg in an amount of, for example, 10 mass % or less may be employed.

Specifically, a 5000 series aluminum alloy or the like can be employed as the aluminum alloy.

The AlN substrate is a substrate of which at least the surface comprises AlN. Specifically, for example, a substrate mainly comprising AlN, or a substrate where an AlN coat layer mainly comprising AlN is formed on a metal substrate such as Al, Cu and steel or on a substrate comprising Si or the like, may be used. The AlN coat layer may be formed throughout the surface of the metal substrate, Si substrate or the like, but it may be sufficient if the coat layer is formed at least on the surface where the molten aluminum layer is formed.

The AlN substrate preferably comprises a Cu substrate mainly comprising Cu and an AlN coat layer mainly comprising AlN formed on the Cu substrate.

In this case, the AlN crystal can be produced on the AlN coat layer by performing the above-described molten aluminum layer-forming step and reaction step. The AlN crystal obtained here contains the Cu substrate at the end part thereof.

Therefore, in the case of joining the AlN crystal, for example, to an external heat conductor such as cooling device and heating element, the crystal can be joined using a metal material. By making use of the characteristic property of a metal material excellent in the thermal conductivity, the joining can be performed without impairing the thermal conductivity between the AlN crystal and the heat conductor. Also, the Cu substrate mainly comprises Cu which is a metal, so that this substrate can be easily bonded to the metal material for joining.

With regard to the method for forming the AlN coat layer on the Cu substrate, for example, a method of thermally spraying an AlN powder on the Cu substrate by plasma spraying may be employed.

Between the Cu substrate and the AlN coat layer, a Cu gradient layer is preferably provided, which contains Cu and AlN, and allows the Cu concentration to decrease and the AlN concentration to increase toward the AlN coat layer from the Cu substrate.

In this case, the thermally conductive and electrically insulating material can be prevented from breakage due to a strain generated by the difference in the thermal expansion between the Cu substrate or AlN coat layer and the AlN crystal.

The AlN substrate having the Cu gradient layer on the Cu substrate can be produced, for example, by thermally spraying a mixed powder of the powder and Cu powder on the Cu substrate while gradually increasing the amount of AlN powder in the mixed powder.

The AlN substrate preferably has boron nitride (BN) particles dispersed at least on the surface where the molten aluminum layer is formed.

In this case, the boron nitride (BN) particle can fulfill the catalyst function of accelerating the production of AlN. The BN particle reacts with the molten aluminum containing an N element and becomes $AlB_{12}$ while producing AlN.

The AlN substrate having dispersed on the surface thereof the BN particles can be produced, for example, by thermally spraying BN particles on the AlN substrate.

The surface of the AlN substrate may not be necessarily flat, and an AlN substrate having a plurality of steps or irregularities on the surface can also be used.

In the reaction step, the molten aluminum layer is heated in an atmosphere of $N_2$ gas, whereby an AlN crystal which comprises an AlN layer mainly comprising AlN can be formed.

In the atmosphere of $N_2$ gas, the gas pressure is preferably set to 0.1 to 10 MPa.

If the gas pressure is less than 0.1 MPa, it may be difficult to sufficiently dissolve the $N_2$ gas in the molten aluminum layer, and a long time may be required for the production of the AlN crystal. Also, a large amount of Al may remain. On the other hand, if the gas pressure exceeds 10 MPa, the reaction for producing AlN may proceed at an excessively high speed and the AlN crystal grain may be fluctuated in the size, shape and the like to decrease the denseness of the AlN crystal.

From the standpoint that a reaction vessel in a high-temperature high-pressure state is required, the gas pressure is preferably 1 MPa or less.

The atmosphere of $N_2$ gas preferably contains an $H_2$ gas in addition to the $N_2$ gas.

In this case, oxidation of the molten aluminum layer can be prevented.

The $H_2$ gas content is preferably from 0.001 to 4 vol %.

In the reaction step, the AlN substrate is preferably heated at a temperature of 650 to 1,500° C.

If the temperature is less than 650° C., the molten aluminum layer may be solidified before AlN is sufficiently produced from the molten aluminum, whereas if the temperature exceeds 1,500° C., the reaction for producing AlN may proceed at an excessively high speed and the denseness of the AlN crystal may decrease. The temperature is more preferably from 750 to 1,200° C.

The molten aluminum layer-forming step and the reaction step are preferably performed in a heating furnace.

In this case, the temperature, atmosphere and the like in the molten aluminum layer-forming step and reaction step can be easily controlled.

In the molten aluminum layer-forming step, it is preferable that metallic magnesium is disposed in the heating furnace, at least a part of the metallic magnesium is evaporated into the atmosphere of non-oxidizing gas in the heating furnace, and formation of the molten aluminum layer is performed in this atmosphere of non-oxidizing gas.

In this case, at the formation of the molten aluminum layer in the molten aluminum layer-forming step, the oxide (aluminum) formed, for example, on the surface of aluminum can be deprived of oxygen by the metallic magnesium in the atmosphere, and a molten aluminum layer with excellent reactivity can be formed, as a result, the reaction between the molten aluminum layer and nitrogen (N) readily proceeds in the reaction step and the formation of the AlN crystal can be accelerated.

The metallic magnesium may be sufficient if it is contained in the atmosphere (non-oxidizing gas atmosphere) by evaporating in the molten aluminum layer-forming step, but the metallic magnesium may also be contained in the atmosphere gas ($N_2$ gas atmosphere), in the subsequent reaction step.

With regard to the metallic magnesium, for example, plate-like or pellet-like magnesium may be employed.

The production method preferably comprises further a continuous stacking step of repeating at least once or more a stacking step of forming a molten aluminum layer on the formed AlN layer in an atmosphere of non-oxidizing gas, and heating the molten aluminum layer in an atmosphere of $N_2$ gas to stack and form an AlN layer mainly comprising AlN.

In this case, an AlN crystal having a large thickness resulting from stacking of a plurality of AlN layers can be produced. Also, the thickness of the AlN crystal can be controlled by adjusting the number of layers stacked.

At this time, in the first stacking step, an AlN crystal inheriting the crystal structure of the AlN layer produced in the reaction step can be grown. Also, in the case of repeating the stacking twice or more, an AlN crystal inheriting the crystal structure of the AlN crystal in the AlN layer formed in the previous stacking step can be grown. Accordingly, in the continuous stacking step, an AlN crystal where the gap between crystalline particles is small and individual crystal grains are grown in a fixed direction can be formed.

In the stacking step, in a similar manner to the molten aluminum layer-forming step, the molten aluminum layer can be formed by dropping a molten aluminum droplet on the AlN layer, and also arraying the droplets on the AlN layer.

Also in this stacking step, for the same reasons as in the molten aluminum layer-forming step, the molten aluminum preferably comprises a magnesium-containing aluminum alloy.

In the stacking step, in a similar manner to the molten aluminum layer-forming step, the molten aluminum layer can also be formed by disposing an aluminum sheet on the AlN layer, and melting the aluminum sheet.

Also in this stacking step, for the same reasons as in the molten aluminum layer-forming step, the aluminum sheet preferably comprises a magnesium-containing aluminum alloy.

Similar to the molten aluminum layer-forming step, the stacking step may be performed in a heating furnace.

At this time, in a similar manner to the molten aluminum layer-forming step, it is possible that metallic magnesium is disposed in the heating furnace, at least a part of the metallic magnesium is evaporated into the atmosphere of non-oxidizing gas in the heating furnace, and formation of the molten aluminum layer is performed in this atmosphere of non-oxidizing gas.

In the stacking step, for the same reasons as in the reaction step, the AlN substrate is preferably heated at a temperature of 650 to 1,500° C.

In the reaction step, the crystal growth is preferably performed such that AlN crystal grains are uniformly arrayed and the gap between crystalline particles becomes small. This can be specifically realized by controlling the temperature in the reaction step and controlling the thickness and the like of the molten aluminum layer.

Also, it is important to dissolve a sufficiently large amount of the $N_2$ gas in the molten aluminum layer. Therefore, as described above, the $N_2$ gas pressure is preferably controlled to be from 0.1 to 10 MPa.

After the AlN crystal is formed, a removing step of removing the AlN substrate from the AlN crystal may be further performed.

In this case, a thermally conductive and electrically insulating material not having the AlN substrate can be obtained. The removing step can be appropriately performed according to end use of the thermally conductive and electrically insulating material.

The production method of the third invention is described below.

In the third invention, a thermally conductive and electrically insulating material comprising an AlN crystal which comprises an AlN layer mainly comprising AlN, and an Al gradient layer formed on the AlN crystal is produced. The Al gradient layer contains Al and AlN and in this layer, the Al concentration increases with distance from the AlN crystal comprising the AlN layer in the stacking direction (the direction in which the AlN crystal and the gradient layer are stacked).

In the third invention, in a similar manner to the first invention, the above-described molten aluminum layer-forming step and reaction step are performed.

Accordingly, also in the third invention, the molten aluminum layer-forming step and the reaction step can be performed in the same preferred embodiments as those of the first invention described above.

For example, also in the third invention, similar to the first invention, the atmosphere of non-oxidizing gas is preferably an atmosphere of $N_2$ gas.

In the molten aluminum layer-forming step, the molten aluminum layer is preferably formed by dropping a molten aluminum droplet on the AlN substrate, and also arraying the droplets on the AlN substrate.

At this time, the molten aluminum preferably comprises a magnesium-containing aluminum alloy.

In the molten aluminum layer-forming step, the molten aluminum layer is preferably formed by disposing an aluminum sheet on the AlN substrate, and melting the aluminum sheet.

At this time, the aluminum sheet preferably comprises a magnesium-containing aluminum alloy.

The AlN substrate preferably has BN particles dispersed at least on the surface where the molten aluminum layer is formed.

The production method in the third invention preferably comprises further a removing step of removing the AlN substrate from the AlN crystal.

The AlN substrate preferably comprises a Cu substrate mainly comprising Cu and an AlN layer mainly comprising AlN formed on the Cu substrate.

Between the Cu substrate and the AlN layer, a Cu gradient layer is preferably comprised, which contains Cu and AlN, and allows the Cu concentration to decrease and the AlN concentration to increase toward the AlN layer from the Cu substrate.

In the third invention, the gradient step is performed. In the gradient step, a heating step of forming a molten aluminum layer on the formed AlN layer in an atmosphere of non-oxidizing gas and heating the molten aluminum layer in an atmosphere of $N_2$ gas is repeated at least twice or more. At this time, the Al gradient layer is formed by decreasing the amount of the $N_2$ gas dissolved in the molten aluminum layer as the heating step is repeated.

In the gradient step, the Al gradient layer can be formed, for example, by gradually decreasing the $N_2$ gas pressure in the atmosphere of $N_2$ gas as the heating step is repeated. The Al gradient layer may also be formed by gradually shortening the heating time in the heating step. Furthermore, the Al gradient layer may also be formed by gradually lowering the heating temperature in the heating step. Also, these methods may be combined.

The production method of the third invention preferably comprises further an Al layer-forming step of forming an Al layer comprising Al on the outermost layer of the Al gradient layer.

In this case, a thermally conductive and electrically insulating material having an Al layer at the end part on the side opposite the AlN substrate side can be produced. Therefore, in the case of joining the thermally conductive and electrically insulating material, for example, to an external heat conductor such as cooling device and heating element, the thermally conductive and electrically insulating material can be joined using a metal material on the Al layer side. In other words, by making use of the characteristic property of a metal material excellent in the thermal conductivity, the joining can be performed without impairing the thermal conductivity between the thermally conductive and electrically insulating material and the heat conductor. Also, the Al layer mainly comprises Al which is a metal, so that this layer can be easily bonded to the metal material for joining.

The Al layer-forming step can be easily realized by, for example, in the gradient step of repeating the heating step, performing the final heating step in an atmosphere containing almost no $N_2$ gas.

In the heating step, the molten aluminum layer may be formed by dropping a molten aluminum droplet on the AlN layer, and also arraying the droplets on the AlN layer.

At this time, similar to the molten aluminum layer-forming step, the molten aluminum preferably comprises a magnesium-containing aluminum alloy.

In the heating step, similar to the molten aluminum layer-forming step, the molten aluminum layer may also be formed by disposing an aluminum sheet on the AlN layer, and melting the aluminum sheet.

As this time, similar to the molten aluminum layer-forming step, the aluminum sheet preferably comprises a magnesium-containing aluminum alloy.

The above-described molten aluminum layer-forming step, reaction step and heating step may be performed in a heating furnace.

In this case, the temperature and atmosphere in these molten aluminum layer-forming step, reaction step and heating step can be easily controlled.

In the above-described molten aluminum layer-forming step and heating step, it is preferred that metallic magnesium is disposed in the heating furnace, at least a part of the metallic magnesium is evaporated into the atmosphere of non-oxidizing gas in the heating furnace, and formation of the molten aluminum layer is performed in this atmosphere of non-oxidizing gas.

In this case, in a similar manner to the first invention, at the formation of the molten aluminum layer, the oxide (alumina) formed, for example, on the surface of aluminum can be deprived of oxygen by the metallic magnesium in the atmosphere, and a molten aluminum layer with excellent reactivity can be formed, as a result, the reaction between the molten aluminum layer and nitrogen (N) readily proceeds in the reaction step and the formation of the AlN crystal can be accelerated.

The metallic magnesium may be sufficient if it is contained in the atmosphere (non-oxidizing gas atmosphere) by evaporating in the molten aluminum layer-forming step and the heating step, but the metallic magnesium may also be contained in the atmosphere gas ($N_2$ gas atmosphere) in the reaction step.

As regards the metallic magnesium, for example, plate-like or pellet-like magnesium may be employed.

In the reaction step and the heating step of the third invention, from the same reasons as those in the reaction step of the first invention, the AlN substrate is preferably heated at a temperature of 650 to 1,500° C.

Between the reaction step and the gradient step of the third invention, similar to the first invention, a continuous stacking step is preferably performed, which is repeating at least once or more a stacking step of forming a molten aluminum layer on the formed AlN layer in an atmosphere of non-oxidizing gas, and heating the molten aluminum layer in an atmosphere of $N_2$ gas to stack and form an AlN layer mainly comprising AlN.

In the stacking step, the same preferred embodiments as those in the first invention may be employed.

For example, in the stacking step, the molten aluminum layer is preferably formed by dropping a molten aluminum droplet on the AlN layer, and also arraying the droplets on the AlN layer.

At this time, the molten aluminum preferably comprises a magnesium-containing aluminum alloy.

Also, in the stacking step, the molten aluminum layer is preferably formed by disposing an aluminum sheet on the AlN layer, and melting the aluminum sheet.

At this time, the aluminum sheet preferably comprises a magnesium-containing aluminum alloy.

The stacking step may be performed in a heating furnace.

At this time, it is possible that metallic magnesium is disposed in the heating furnace, at least a part of the metallic magnesium is evaporated into the atmosphere of non-oxidizing gas in the heating furnace, and formation of the molten aluminum layer is performed in this atmosphere of non-oxidizing gas.

Furthermore, in the stacking step, the AlN substrate is preferably heated at a temperature of 650 to 1,500° C.

EXAMPLES

Example 1

Examples of the present invention are described below by referring to FIGS. 1 to 13.

In the present invention, a thermally conductive and electrically insulating material containing an AlN crystal mainly comprising AlN is produced by performing a molten aluminum layer-forming step and a reaction step.

Figure 8:
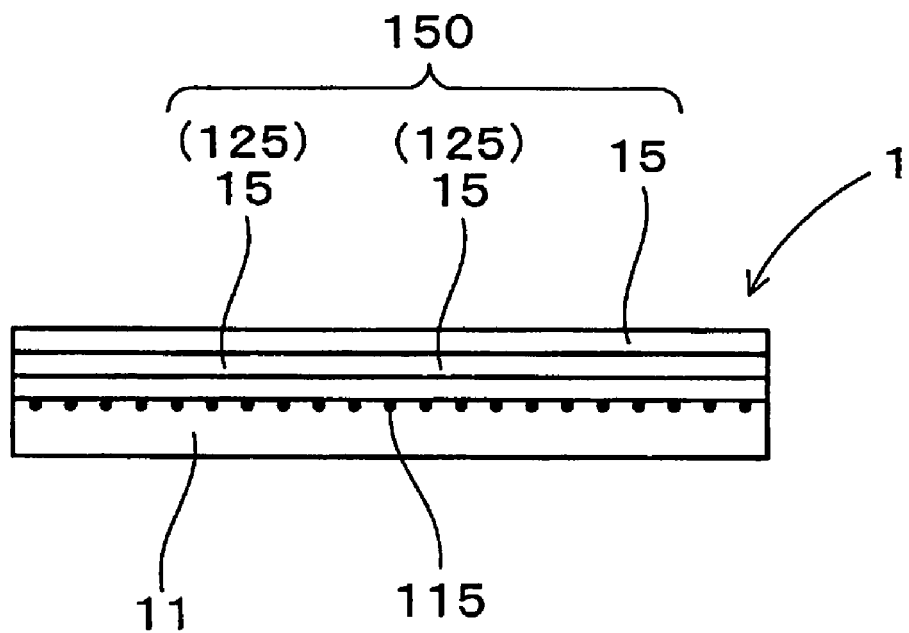
FIG. 8 shows an explanatory view illustrating the state of an AlN crystal comprising an AlN layer being formed on the AlN substrate according to Example 1.

As shown in FIG. 8, the thermally conductive and electrically insulating material 1 of the present invention contains an AlN crystal 150 which comprises an AlN layer 15 mainly comprising AlN. Particularly, in this Example, a thermally conductive and electrically insulating material 1 containing an AlN crystal 150 obtained by stacking a plurality of AlN layers 15 is produced.

Figure 2:
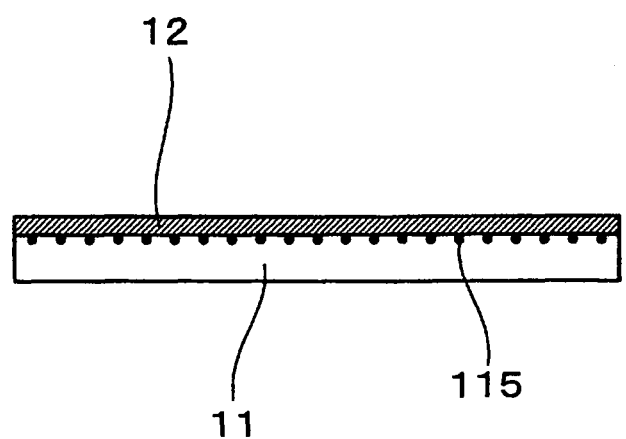
FIG. 2 shows an explanatory view illustrating the state of an aluminum sheet being disposed on the AlN substrate according to Example 1.
Figure 3:
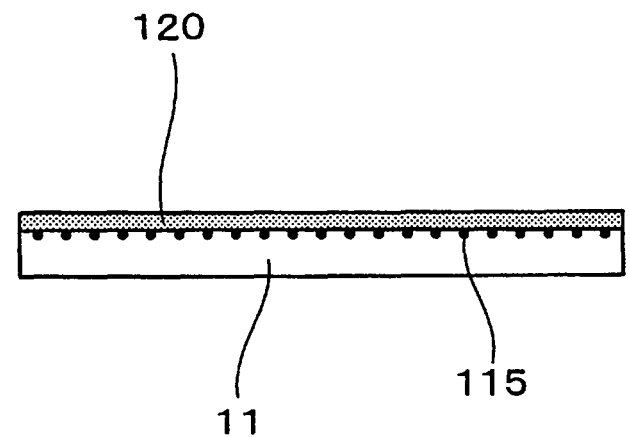
FIG. 3 shows an explanatory view illustrating the state of a molten aluminum layer being formed on the AlN substrate according to Example 1.
Figure 4:
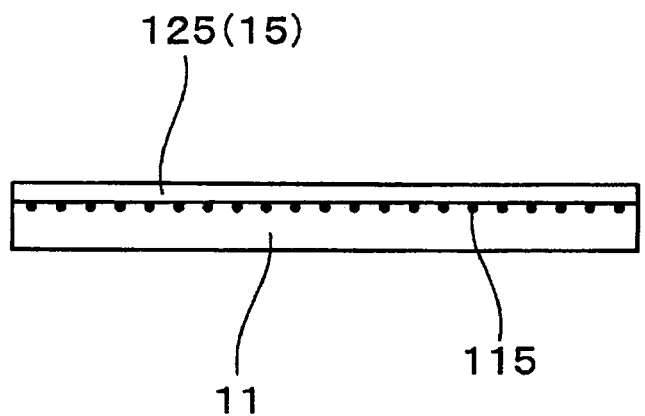
FIG. 4 shows an explanatory view illustrating the state of an AlN layer being formed on the AlN substrate according to Example 1.

In the molten aluminum layer-forming step, as shown in FIG. 3, a molten aluminum layer 120 is formed on an AlN substrate 11 of which at least the surface comprises AlN, in an atmosphere of non-oxidizing gas. In the molten aluminum layer-forming step of this Example, as shown in FIGS. 2 and 3, an aluminum sheet 12 is disposed on the AlN substrate 11, and aluminum sheet 12 is melted, whereby the molten aluminum layer 120 is formed. Also, in the reaction step, the molten aluminum layer 120 is heated in an atmosphere of $N_2$ gas, whereby an AlN crystal which comprises an AlN layer 15 mainly comprising AlN is formed.

The production method of the thermally conductive and electrically insulating material 1 of this Example is described in detail below by referring to FIGS. 1 to 9.

Figure 9:
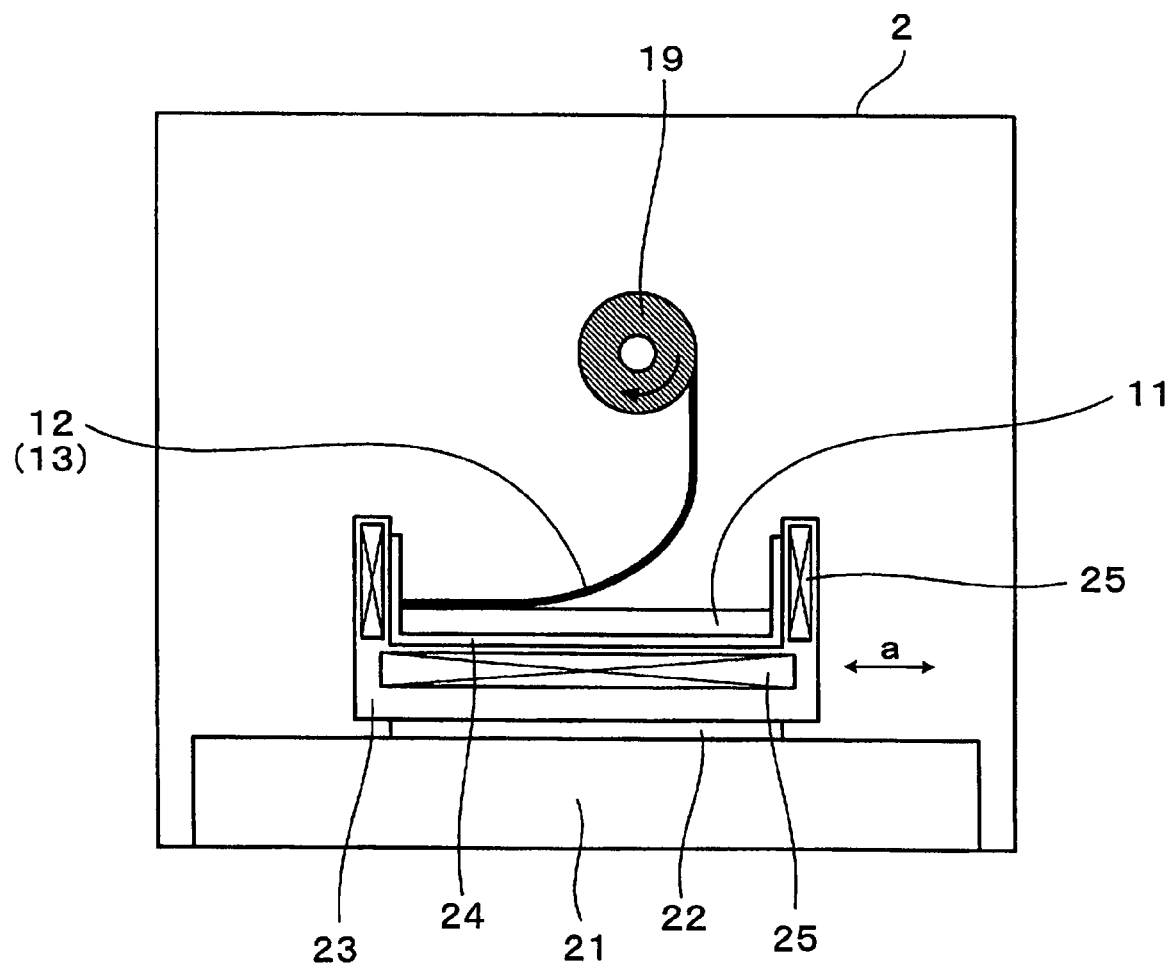
FIG. 9 shows an explanatory view illustrating the construction of the heating furnace according to Example 1.

In this Example, as shown in FIG. 9, the thermally conductive and electrically insulating material is produced using a heating furnace 2. Heating furnace 2 has a pedestal 21 having built into the bottom thereof a movable device (not shown). A movable part 22 of the movable device protrudes from pedestal 21, and a movable pedestal 23 concaved in cross-section is connected to the movable part 22. The movable pedestal 23 can be parallelly moved in the direction of the arrow a in the Figure as well as in the direction perpendicular to the arrow a. In the movable pedestal 23, a crucible 24 for disposing the AlN substrate 11 therein is disposed. A heater 25 is embedded in the bottom and outer wall of the deep dish-like movable pedestal 23 and can heat the AlN substrate 11 disposed in the crucible 24.

Also, an aluminum roll 19 obtained by winding a 0.018 mm-thick aluminum sheet (aluminum foil) 12 (13) around a roll is disposed above the movable pedestal 23.

An AlN substrate 11 comprising an AlN crystal, on which surface, as shown in FIG. 1, BN particles 115 were dispersed and disposed, was prepared.

The AlN substrate 11 was, as shown in FIG. 9, disposed in the crucible 24 on the movable pedestal 23 in the heating furnace 2, and the inside of the heating furnace 2 was vacuumized to create a nearly vacuum state of about $10^{-6}$ Pa. An $N_2$ gas was then introduced into the heating furnace 2, and the pressure in the heating furnace 2 was set to 1 MPa. The $N_2$ gas used in this Example contains about 4 vol % of $H_2$ in addition to $N_2$.

Subsequently, as shown in FIG. 9, the heater 25 was actuated to heat the AlN substrate 11 disposed in the crucible 23 to a temperature of 800° C., the aluminum roll 19 was rotated to allow the aluminum sheet 12 to hang down, and the aluminum sheet 12 was disposed on the AlN substrate 11. At this time, the aluminum sheet 12 was disposed to lie from one end part toward another end part on the AlN substrate 11 by parallelly moving the movable pedestal 23 (see, FIG. 2). The aluminum sheet continuing to the aluminum roll 19 was separated from the aluminum roll 19 as a result of melting of the aluminum sheet 12 disposed on the AlN substrate 11.

In this way, the aluminum sheet 12 was disposed on the AlN substrate 11 and at the same time, the aluminum sheet 12 was melted by the heat of the heated AlN substrate 11, whereby, as shown in FIG. 3, a molten aluminum layer 120 having a thickness of about 0.018 mm was formed on the AlN substrate 11.

The molten aluminum layer 120 on the AlN substrate 11 was then heated by the heater 25 at a temperature of 800° C. for 2 hours (see, FIGS. 9 and 3). As a result, the molten aluminum layer 120 reacted with the $N_2$ gas in the heating furnace 2, and an AlN layer 125 mainly comprising AlN was formed on the AlN substrate 11 (see, FIGS. 3, 4 and 9). In this way, an AlN crystal comprising an AlN layer 125 was produced on the AlN substrate 11.

In this Example, a continuous stacking step of repeating a stacking step of again forming a molten aluminum layer 130 on the formed AlN layer 125 and heating the molten aluminum layer 130 in an atmosphere of $N_2$ gas to stack and form an AlN layer 135 mainly comprising AlN was performed (see, FIGS. 5 to 8).

Figure 5:
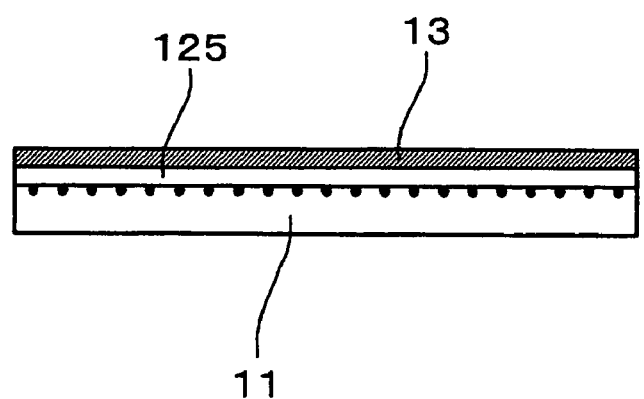
FIG. 5 shows an explanatory view illustrating the state of an aluminum sheet being disposed on the AlN layer formed on the AlN substrate according to Example 1.
Figure 6:
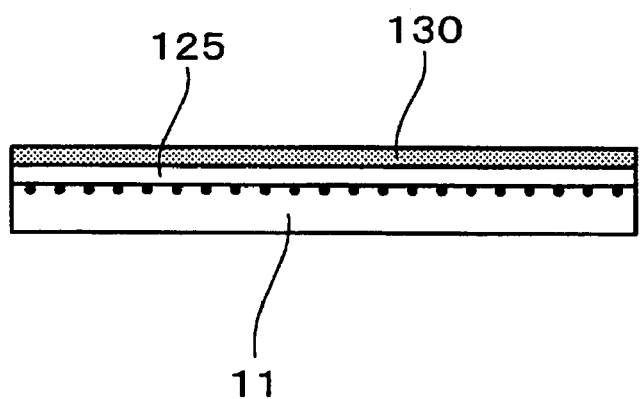
FIG. 6 shows an explanatory view illustrating the state of a molten aluminum layer being formed on the AlN layer formed on the AlN substrate according to Example 1.
Figure 7:
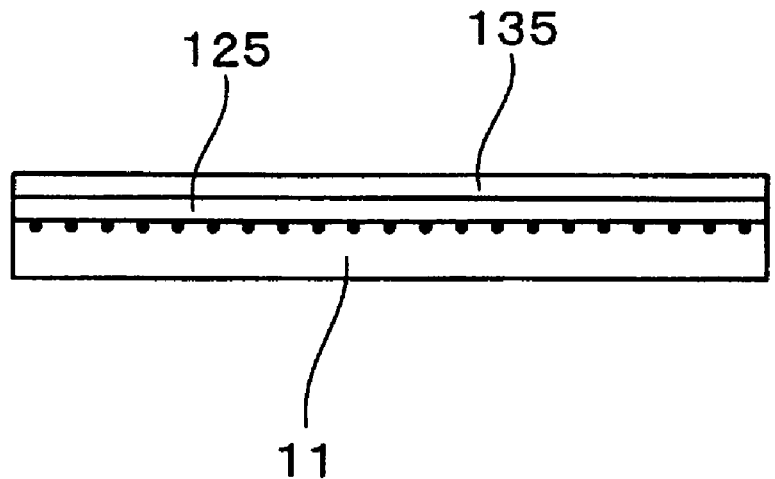
FIG. 7 shows an explanatory view illustrating the state of an AlN layer being stacked and formed on the AlN layer formed on the AlN substrate according to Example 1.

In other words, as shown in FIG. 5, the aluminum sheet 13 supplied from the aluminum roll 19 was disposed on the AlN layer 125 formed on the AlN substrate 11, by the same method as above and at the same time, the aluminum sheet 13 was melted to form, as shown in FIG. 6, a molten aluminum layer 130 on the AlN substrate 11. This molten aluminum layer 130 was heated to react the molten aluminum layer 130 with the $N_2$ gas, whereby, as shown in FIG. 7, an AlN layer 135 mainly comprising AlN was stacked and formed. By further repeating the stacking and formation, an AlN crystal 150 where, as shown in FIG. 8, a plurality of AlN layers 15 were stacked and formed was produced. In this way, a thermally conductive and electrically insulating material 1 containing an AlN crystal was obtained. This is designated as Sample E.

Furthermore, in this Example, in order to make clear the characteristic features of Sample E produced above, an AlN crystal obtained by sintering an AlN particle was produced (Sample C) for comparison.

More specifically, an AlN particle and an organic binder were mixed to obtain a mixed raw material, this mixed raw material was shaped into a sheet form to obtain a particle compact, and the particle compact was fired at a temperature of about 1,500° C. for about 4 hours to obtain an AlN crystal comprising an AlN sintered body. This is designated as Sample C.

Figure 10:
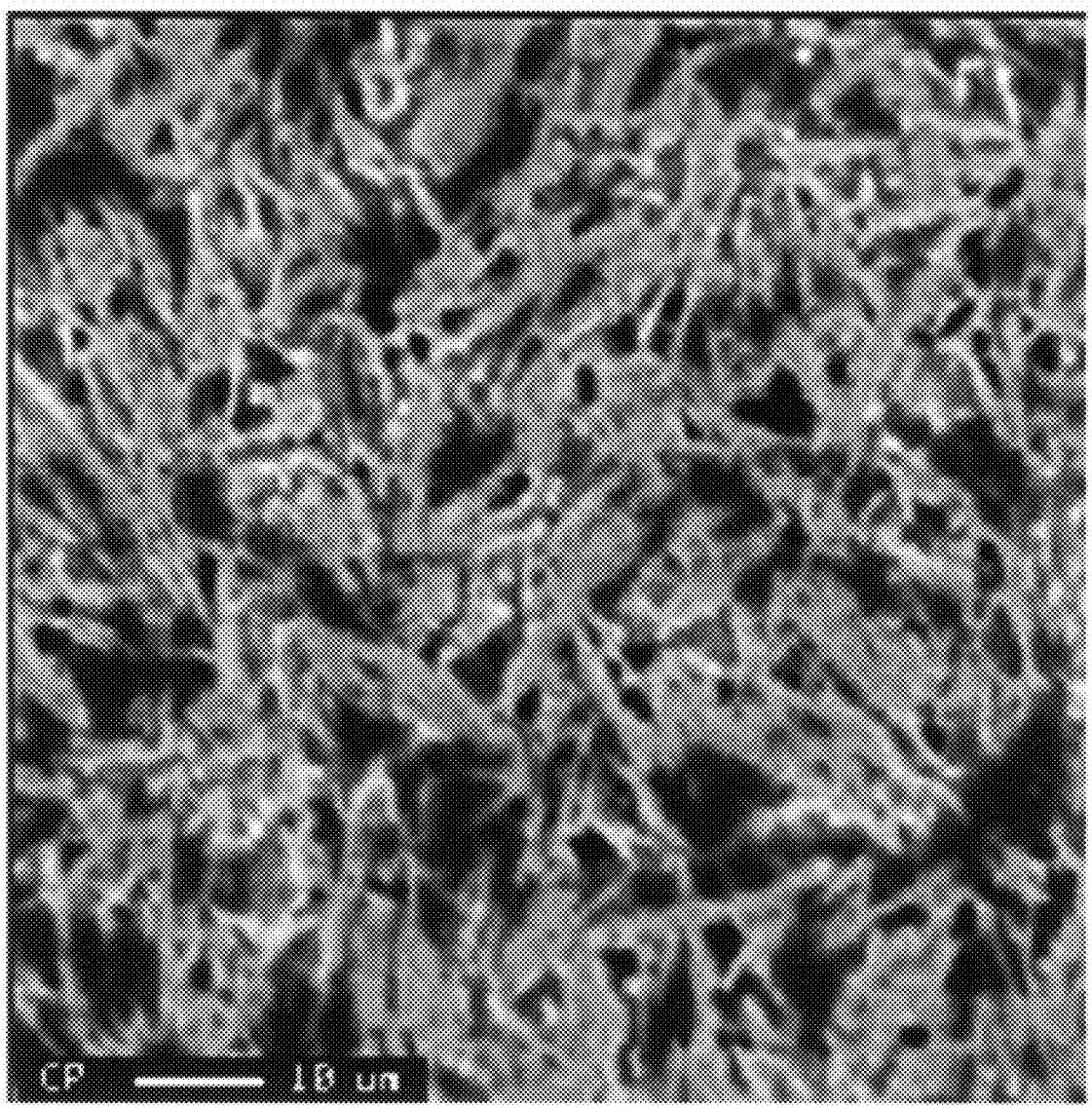
FIG. 10 shows a photograph substituted for a drawing showing how the cross-section of the AlN crystal of the thermally conductive and electrically insulating material (Sample E) is observed by an electron microscope according to Example 1.

With respect to Sample E and Sample C, the cross-section was observed through a scanning electron microscope (SEM), and the difference in the crystal structure was compared. Incidentally, as for Sample E, the cross-section of the AlN crystal 150 was observed by SEM (see, FIG. 8). The results are shown in FIG. 10 (Sample E) and FIG. 11 (Sample C).

Figure 11:
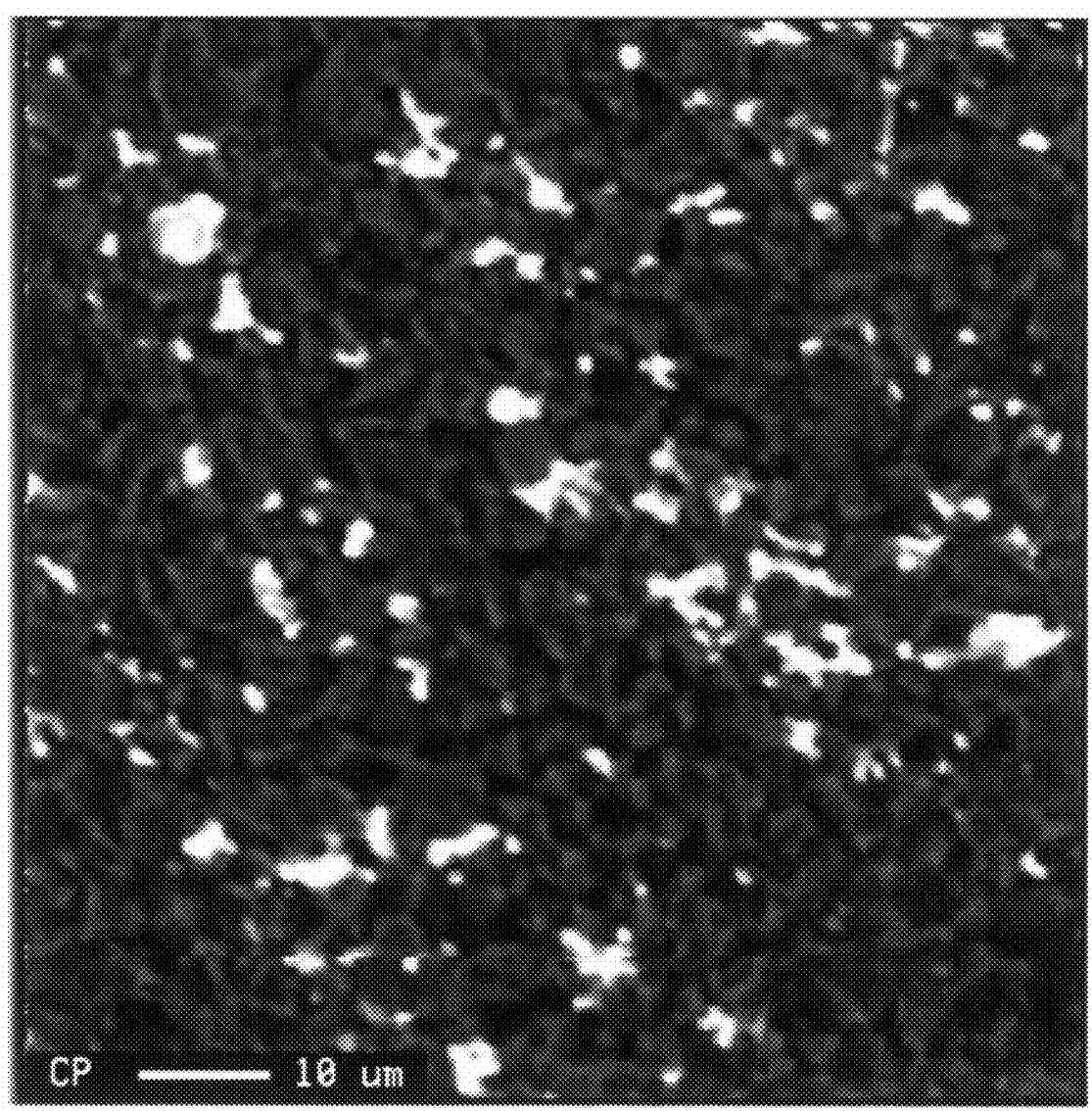
FIG. 11 shows a photograph substituted for a drawing showing how the cross-section of the AlN crystal produced by sintering (Sample C) is observed by an electron microscope according to Example 1.

As shown in FIG. 11, in Sample C, a nearly spherical AlN crystal grain is sintered. On the other hand, as shown in FIG. 10, in Sample E, crystal grains are individually grown in a fixed direction to form an AlN crystal having a large aspect ratio. It is also seen that in Sample E, the gap between AlN crystal grains is small and AlN crystal grains are closely spaced.

Thus, Sample E had a crystal structure distinctly different from that of the AlN crystal produced by sintering (Sample C).

The reason why the above-described characteristic crystal structure is formed in Sample E is considered because in the step of reacting the molten aluminum layer 120 or 130 with the $N_2$ gas to form an AlN crystal layer comprising an AlN layer 15 (reaction step and stacking step), the AlN crystal grain deposited has grown while inheriting the crystal structure of the hexagonal AlN crystalline particle on the surface of the AlN substrate 11 or the AlN layer 125 (see, FIGS. 3, 4, 6 and 7), as a result, a thermally conductive and electrically insulating material containing an AlN crystal in which the gap between crystalline particles is small and which comprises an AlN crystal grain having a high aspect ratio can be produced. Therefore, the thermally conductive and electrically insulating material of the present invention can not only exhibit insulating property but also exert excellent thermal conductivity.

In this Example, an AlN substrate comprising AlN was used, but the AlN substrate needs not be a substrate with the entirety comprising AlN and may be sufficient if at least the surface where the molten aluminum layer is formed comprises AlN.

Figure 12:
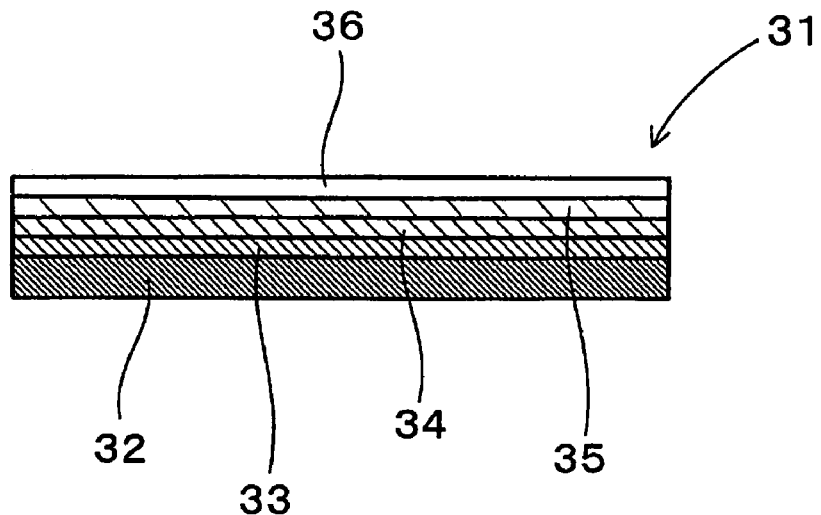
FIG. 12 shows an explanatory view illustrating the construction of the AlN substrate having a Cu gradient layer between a Cu substrate and an AlN coat layer according to Example 1.

Also, as shown in FIG. 12, an AlN substrate 31 having a Cu substrate 32 mainly comprising Cu, an AlN coat layer mainly comprising AlN, and Cu gradient layers 33, 34 an 35 formed between the Cu substrate 32 and the AlN coat layer 36 may be used. These Cu gradient layers 33, 34 and 35 are a layer containing Cu and AlN, where from the Cu substrate 32 toward the AlN coat layer 36, the Cu concentration is decreased and the AlN concentration is increased.

The AlN substrate 31 having the Cu gradient layers 33, 34 and 35 can be produced by spraying the AlN powder and/or Cu powder on a Cu substrate 32 by plasma spraying or the like.

In other words, a mixed powder of the AlN powder and Cu powder is sprayed on a Cu substrate 32 to form a Cu—Al layer 33 comprising a Cu powder and AlN powder, and the mixed powder is further sequentially sprayed on the Cu—Al layer 33 to sequentially stack and form Cu—Al layers 34 and 35. At this time, the blending ratio of the Cu powder in the mixed powder is gradually decreased while increasing the ratio of the AlN powder every time the Cu—Al layer 34 (35) is sequentially stacked and formed on the Cu—Al layer 33 (34), whereby Cu gradient layers 33, 34 and 35 can be formed.

Subsequently, the AlN powder is sprayed on the Cu gradient layer 35 to from an AlN coat layer 36.

In this way, an AlN substrate 31 where, as shown in FIG. 12, Cu gradient layers 33, 34 and 35 and an AlN coat layer 36 are sequentially stacked on a Cu substrate 32 can be obtained.

Figure 13:
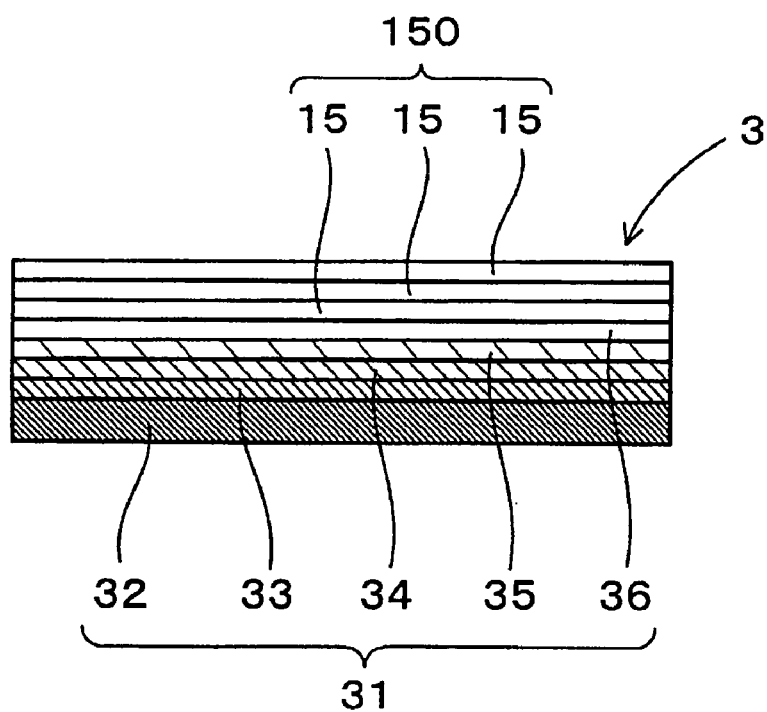
FIG. 13 shows an explanatory view illustrating the state of the AlN crystal comprising an AlN layer being formed on the AlN substrate having a Cu gradient layer according to Example 1.

An AlN crystal 150 comprising an AlN layer 15 is formed using the AlN substrate 31 by performing the same melting step, reaction step and continuous stacking step as those in this Example, as a result, a thermally conductive and electrically insulating material 3 having, as shown in FIG. 13, a Cu substrate 32 at one end part in the stacking direction and an AlN crystal 150 comprising an AlN layer 15 on another end part side can be produced.

The thermally conductive and electrically insulating material 3 has a Cu substrate 32 at the end part, so that when the thermally conductive and electrically insulating material 3 is joined, for example, to an external heat conductor such as cooling device and heating element, the Cu substrate 32 side can be joined using a metal material. In this case, by making use of the characteristic property of a metal material excellent in the thermal conductivity, those two members can be joined without impairing the thermal conductivity between the thermally conductive and electrically insulating material 3 and the heat conductor. Also, the Cu substrate 32 mainly comprises Cu which is a metal, so that this substrate can be easily bonded to the metal material for joining.

The thermally conductive and electrically insulating material 3 has Cu gradient layers 33, 34 and 35 between the Cu substrate 32 and the AlN crystal 150 comprising an AlN layer 15. Therefore, in the thermally conductive and electrically insulating material 3, the difference in thermal expansion between the Cu substrate and the AlN layer can be relieved by the Cu gradient layers 33, 34 and 35 and in turn, deformation, breakage or the like due to difference in the thermal expansion can be prevented.

Example 2

In this Example, the molten aluminum layer is formed by a method different from that in Example 1 to produce a thermally conductive and electrically insulating material.

Figure 14:
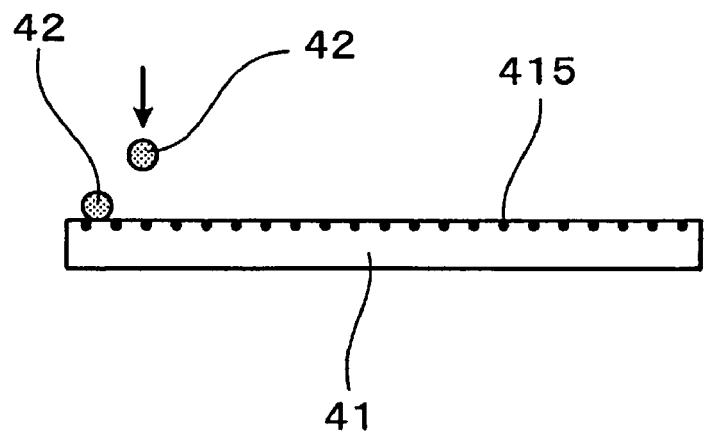
FIG. 14 shows an explanatory view illustrating how the molten aluminum droplet is disposed on the AlN substrate according to Example 2.
Figure 15:
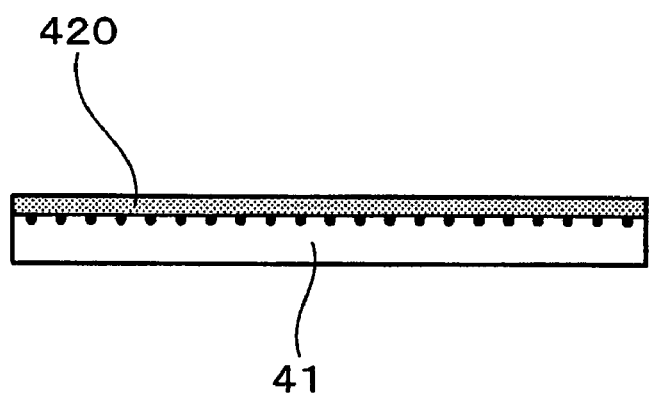
FIG. 15 shows an explanatory view illustrating the state of a molten aluminum layer being formed on the AlN substrate according to Example 2.
Figure 21:
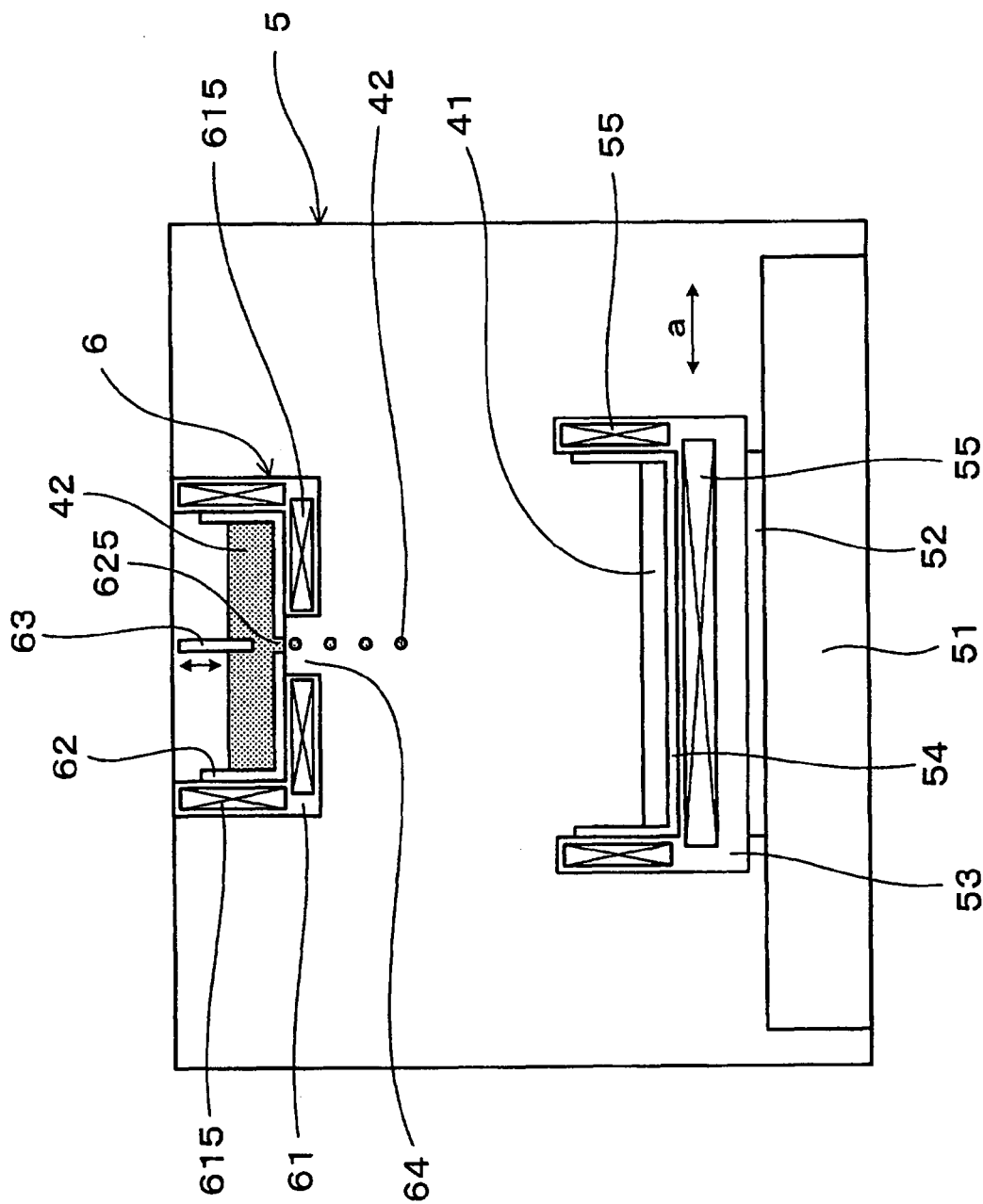
FIG. 21 shows an explanatory view illustrating the construction of the heating furnace according to Example 2.

In other words, in this Example, as shown in FIGS. 14, 15 and 21, the molten aluminum layer 420 is formed by dropping a molten aluminum droplet 42 on an AlN substrate 41 and also arraying the droplets 42 on the AlN substrate 41.

In this Example, a thermally conductive and electrically insulating material 4 is produced using a heating furnace 5 shown in FIG. 21.

As shown in the Figure, the heating furnace 5 comprises, at the bottom, a pedestal 51, a movable device (not shown), a movable part 52, a movable pedestal 53, a crucible 54 and a heater 55 in the same construction as that of the heating furnace 2 (see, FIG. 9) in Example 1. Also, on the top of the heating furnace 5, an aluminum supply tank 6 is disposed at the position opposing the movable pedestal 53. The molten aluminum supply tank 6 comprises a crucible 62 having formed on the bottom center thereof a droplet supplying hole 625 of 10 to 300 μm in diameter and a pedestal 61 connected to the top of the heating furnace 5 for holding the crucible 62. In the pedestal 61, a hole 64 allowing a droplet 42 falling through the droplet supplying hole 625 to pass through is formed. Also, a heater 615 is embedded in the pedestal 61, and the inside of the crucible 62 can be heated by this heater 615.

Furthermore, a control rod 63 capable of opening and closing the supplying hole 625 is inserted into the droplet supplying hole 625 of the crucible 62. The opening and closing of the droplet supplying hole 625 can be controlled by taking out and putting in the control rod 63 inserted into the supplying hole 625.

The production method of the thermally conductive and electrically insulating material of this Example is described in detail below.

In a similar manner to Example 1, an AlN substrate 41 comprising an AlN crystal, on which surface, as shown in FIG. 14, BN particles 415 were dispersed and disposed, was prepared. This AlN substrate 41 was disposed in the crucible 54 on the movable pedestal 53 in the heating furnace 5 (see, FIG. 21).

A molten aluminum was supplied into the crucible 62 of the molten aluminum supply tank 6 and also, the melted state was kept under heating by the heater 625. At this time, the control rod 63 was inserted into the droplet supplying hole 625 to clog the droplet supplying hole 625.

Subsequently, in a similar manner to Example 1, the inside of the heating furnace 5 was vacuumized, and an $N_2$ gas containing about 4 vol % of $H_2$ gas was then introduced into the heating furnace 5. Furthermore, the heater 55 was actuated to heat the AlN substrate 41 disposed in the crucible 54 to a temperature of 800° C.

Then, an operation of withdrawing the control rod 63 from the droplet supplying hole 625 and an operation of inserting it into the droplet supplying hole 625 were repeated at constant cycles to continuously drop a molten aluminum droplet 42 in a size of 10 to 50 μm through the droplet supplying hole 625. Also, as shown in FIGS. 14 and 21, the movable pedestal 53 was parallelly moved in the arrow b direction and the direction perpendicular to the arrow b every time the droplet 42 reached the AlN substrate 41, whereby the molten aluminum droplets 42 were arrayed on the AlN substrate 41. By repeating this operation, as shown in FIG. 15, a molten aluminum layer 420 was formed on the AlN substrate 41.

Figure 16:
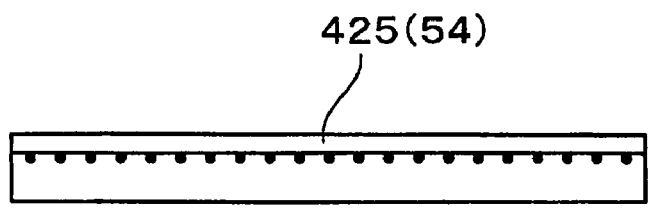
FIG. 16 shows an explanatory view illustrating the state of an AlN layer being formed on the AlN substrate according to Example 2.
Figure 17:
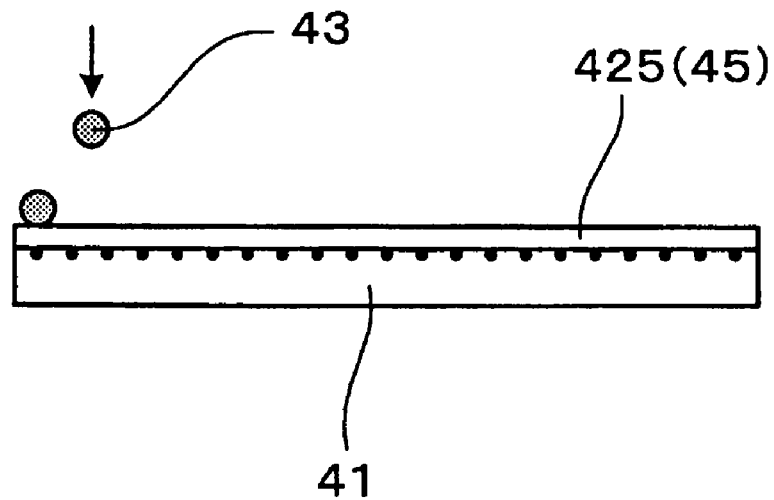
FIG. 17 shows an explanatory view illustrating how a molten aluminum droplet is disposed on the AlN layer formed on the AlN substrate according to Example 2.
Figure 18:
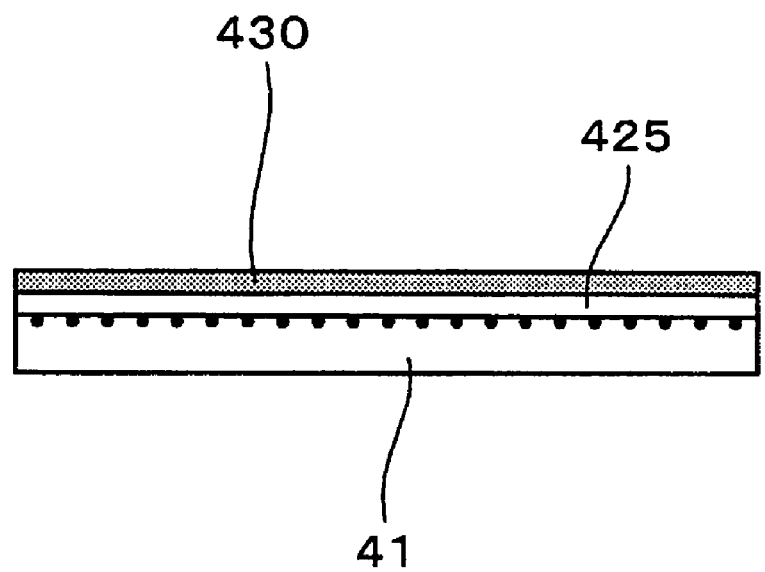
FIG. 18 shows an explanatory view illustrating the state of a molten aluminum layer being formed on the AlN layer formed on the AlN substrate according to Example 2.
Figure 19:
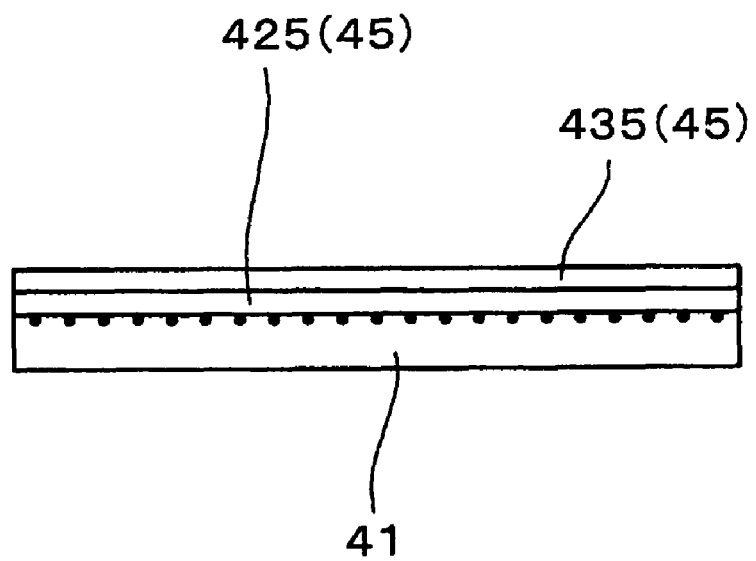
FIG. 19 shows an explanatory view illustrating the state of an AlN layer being stacked and formed on the AlN layer formed on the AlN substrate according to Example 2.
Figure 20:
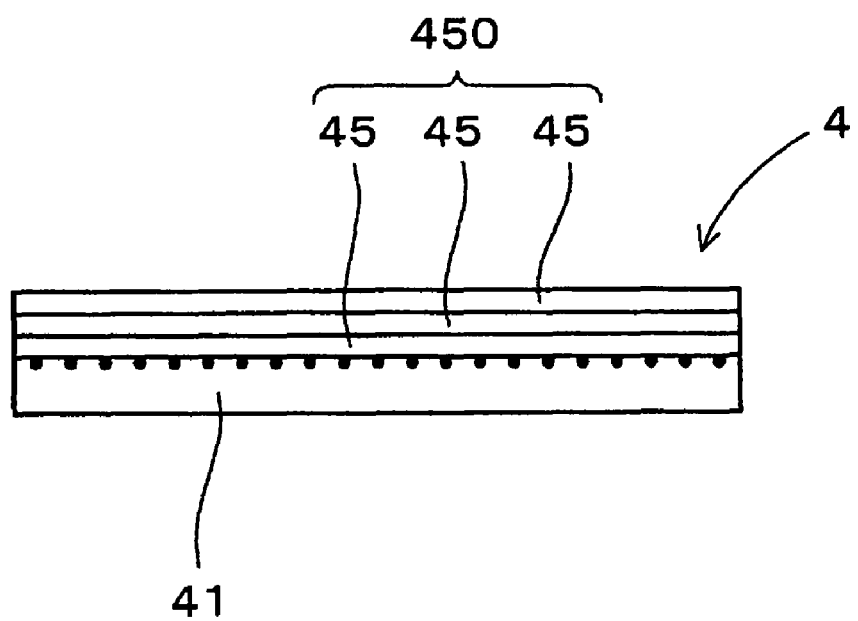
FIG. 20 shows an explanatory view illustrating the state of an AlN crystal comprising an AlN layer being formed on the AlN substrate according to Example 2.

Thereafter, in a similar manner to Example 1, the molten aluminum layer 420 was heated in an atmosphere of $N_2$ gas to react the molten aluminum layer 420 with the $N_2$ gas and form an AlN layer 425 mainly comprising AlN (see, FIG. 16). Furthermore, a stacking step of dropping a molten aluminum droplet 43 on the formed AlN layer 425 to again form a molten aluminum layer 430 and heating the molten aluminum layer 430 in an atmosphere of $N_2$ gas to stack and form an AlN layer 435 mainly comprising AlN was repeated (see, FIGS. 17 to 20). In this way, as shown in FIG. 20, a thermally conductive and electrically insulating material 4 comprising an AlN substrate 41 having thereon an AlN crystal 450 comprising an AlN layer 45 was produced.

Also in the AlN crystal 450 of the thermally conductive and electrically insulating material 4 produced in this Example, in a similar manner to Example 1, an AlN crystal grain having a large aspect ratio was formed (not shown). Furthermore, the gap between AlN crystal grains was small and AlN crystal grains were closely spaced.

Example 3

Figure 26:
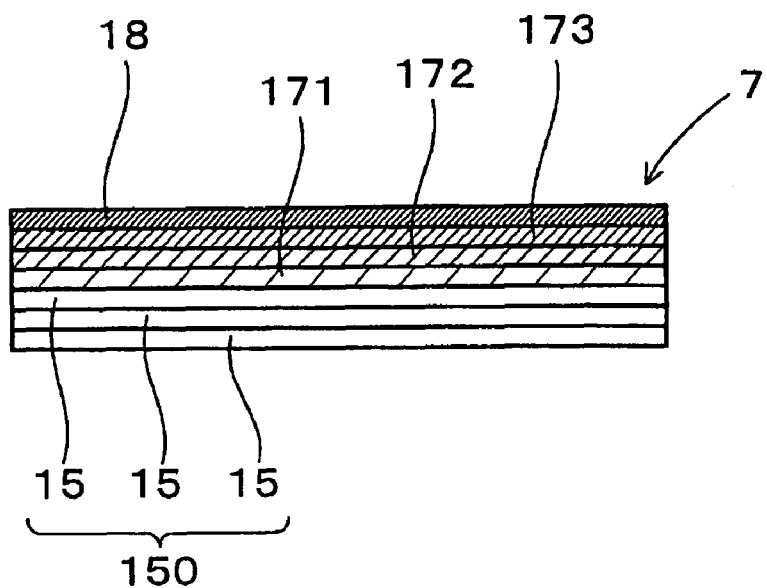
FIG. 26 shows an explanatory view illustrating the construction of the thermally conductive and electrically insulating material comprising an AlN crystal and an Al gradient layer according to Example 3.

In this Example, as shown in FIG. 26, a thermally conductive and electrically insulating material 7 having an AlN crystal 150 which comprises an AlN layer 15 mainly comprising AlN, and Al gradient layers 171, 172 and 173 which each contains AlN and Al and are formed on the AlN layer 15 and in which the Al concentration increases with distance from the AlN layer 15, is produced.

In the production of the thermally conductive and electrically insulating material 7 of this Example, in a similar manner to Example 1, the same thermally conductive and electrically insulating material 1 as Sample E1 was first produced using a heating furnace 2 (see, FIGS. 8 and 9).

Figure 22:
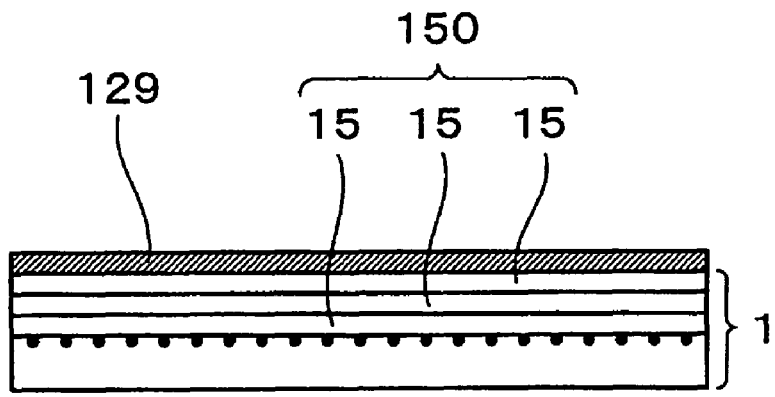
FIG. 22 shows an explanatory view illustrating the state of an aluminum sheet being disposed on the AlN crystal comprising an AlN layer formed on the AlN substrate according to Example 3.
Figure 23:
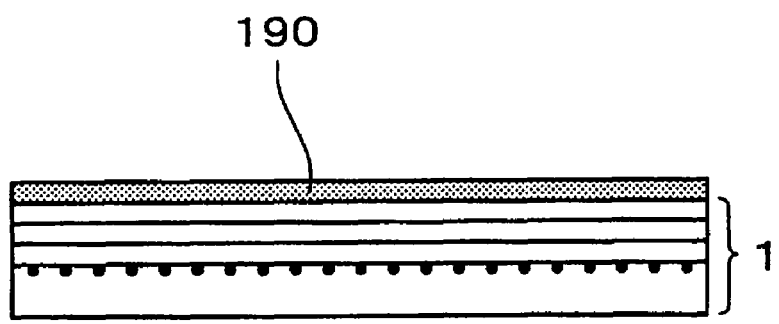
FIG. 23 shows an explanatory view illustrating the state of a molten aluminum being formed on the AlN crystal comprising an AlN layer formed on the AlN substrate according to Example 3.
Figure 24:
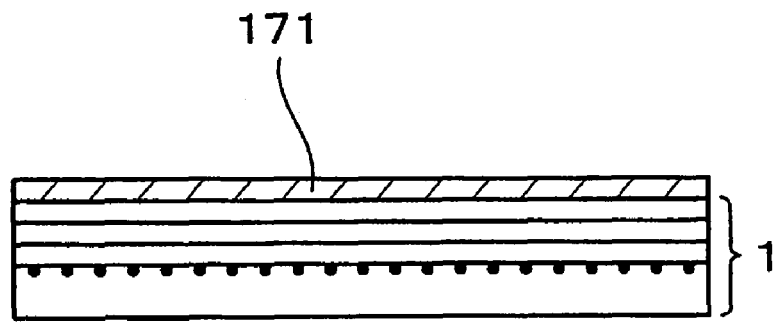
FIG. 24 shows an explanatory view illustrating the state of an Al gradient layer (first layer) being formed on the AlN crystal comprising an AlN layer formed on the AlN substrate according to Example 3.

Subsequently, in a similar manner to Example 1, an aluminum sheet 129 was disposed on the AlN crystal 150 of the thermally conductive and electrically insulating material 1 (see, FIG. 22), and the aluminum sheet 129 was melted to form a molten aluminum layer 190 (see, FIG. 23). Furthermore, AlN in the molten aluminum layer 190 was partially reacted with an $N_2$ gas under heating to deposit AlN. In this way, an Al gradient layer 171 containing Al and AlN was formed.

A step of again disposing an aluminum sheet on the AlN gradient layer 171 and forming a molten aluminum layer and a step of heating it in an atmosphere of $N_2$ gas were further repeated to stack and form AlN gradient layers 171, 172 and 173. (see, FIG. 25). The AlN gradient layers 171, 172 and 173 of this Example were formed by decreasing the $N_2$ gas pressure in the heating furnace every time the stacking and formation were repeated. Accordingly, the Al gradient layers 171, 172 and 173 contain Al in a higher concentration with increasing distance from the AlN crystal 150 comprising an AlN layer 15. Then, a molten aluminum layer was formed on the Al gradient layer 173 under $N_2$ gas-free atmosphere conditions (in an atmosphere of non-oxidizing gas) and solidified under cooling to form an Al layer 18 (see, FIG. 25).

Figure 25:
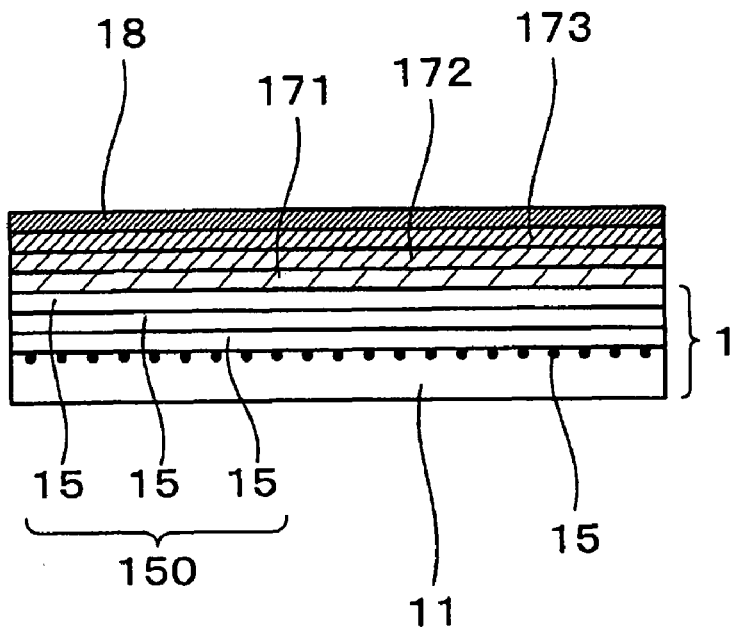
FIG. 25 shows an explanatory view illustrating the state of an Al gradient layer and an Al layer being formed on the AlN crystal comprising an AlN layer formed on the AlN substrate according to Example 3.

Thereafter, as shown in FIGS. 25 and 26, the AlN substrate 11 was removed by cutting from the aluminum crystal 150.

In this way, a thermally conductive and electrically insulating material 7 where, as shown in FIG. 26, an AlN crystal 150 comprising an AlN layer 15 formed by crystal growth, Al gradient layers 171, 172 and 173, and an Al layer 18 were sequentially stacked and formed was obtained.

The thermally conductive and electrically insulating material 7 of this Example has Al gradient layers 171, 172 and 173, so that when joining the thermally conductive and electrically insulating material 7, for example, to an external heat conductor such as cooling device and heating element at the side where the Al gradient layer is formed, the thermally conductive and electrically insulating material can be joined using a metal material. In other words, by making use of the characteristic property of a metal material excellent in the thermal conductivity, the joining can be performed without impairing the thermal conductivity between the thermally conductive and electrically insulating material 7 and the heat conductor. Also, the Al gradient layer contains Al which is a metal, so that this layer can be easily bonded to the metal material for joining.

Furthermore, the Al gradient layers 171, 172 and 173 can relieve the difference in thermal expansion between the Al layer 18 and the AlN crystal 150 and in turn, the thermally conductive and electrically insulating material 7 can be prevented from breaking as a result of generation of a strain due to difference in the thermal expansion between the Al gradient layer and the AlN crystal 150.

Figure 27:
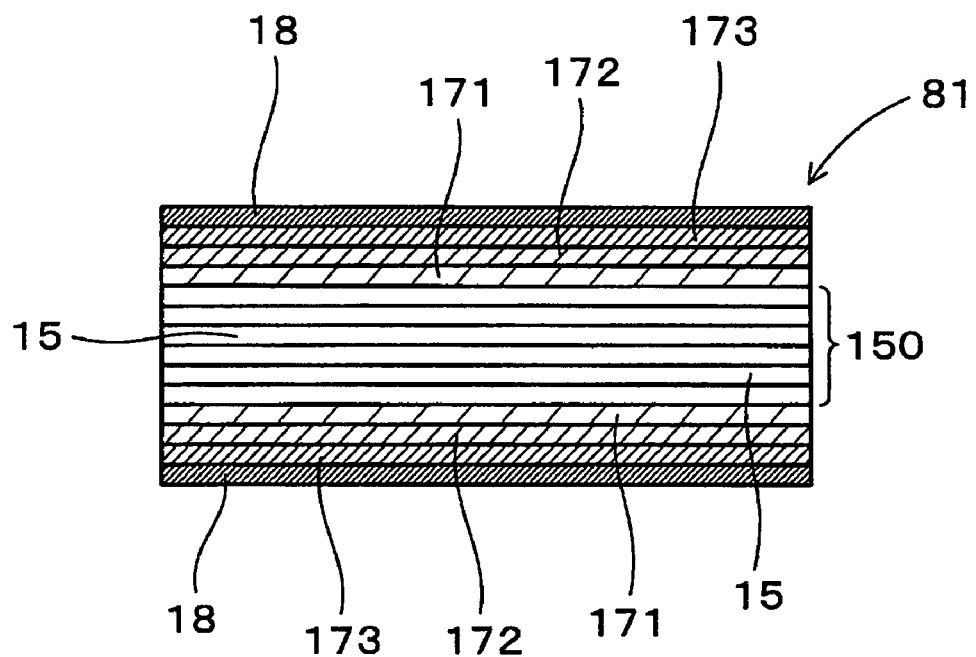
FIG. 27 shows an explanatory view illustrating the construction of the thermally conductive and electrically insulating material having an Al gradient layer and an Al layer at both end parts in the stacking direction of the AlN crystal obtained by stacking and forming AlN layers according to Example 3.

Also, when two units of the thermally conductive and electrically insulating material 7 produced in this Example were produced and bonded at the AlN crystal 150 sides, a thermally conductive and electrically insulating material 81 having, as shown in FIG. 27, an AlN crystal comprising an AlN layer and at the same time, having Al gradient layers 171, 172 and 173 and an Al layer 18 at both end parts in the stacking direction can be produced. As regards the adhesive used for the lamination, for example, an adhesive having a low melting point, such as $SiO_2$, can be used.

Figure 28:
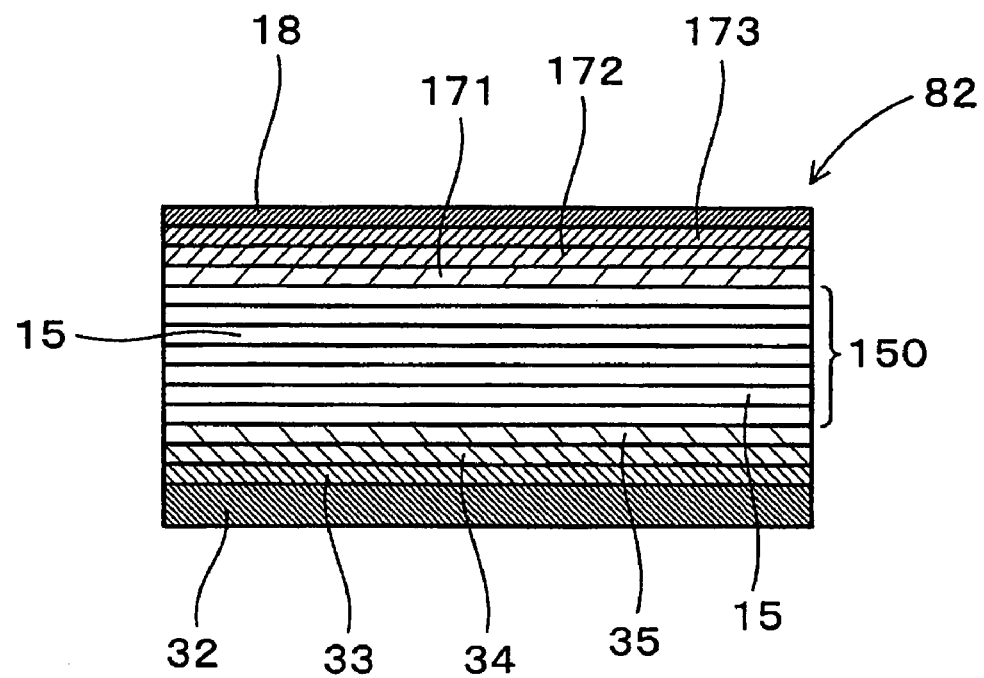
FIG. 28 shows an explanatory view illustrating the construction of the thermally conductive and electrically insulating material having an Al gradient layer and an Al layer at one end part in the stacking direction of the AlN crystal obtained by stacking and forming AlN layers and having a Cu gradient layer and a Cu substrate at another end part according to Example 3.

The thermally conductive and electrically insulating material 2 of Example 1 having Cu gradient layers 33, 34 and 35 between the Cu substrate 32 and the AlN crystal 150 comprising an AlN layer 15 and the thermally conductive and electrically insulating material 7 of this Example may also be bonded together at the AlN crystals 150. In this case, as shown in FIG. 28, a thermally conductive and electrically insulating material 82 containing an AlN crystal 150 comprising an AlN layer 15 and at the same time, having Al gradient layers 171, 172 and 173 and an Al layer 18 at one end part in the stacking direction and Cu gradient layers 33, 34 and 35 and a Cu substrate 32 at another end part can be produced.

Example 4

In Examples 1 to 3, a thermally conductive and electrically insulating material is produced using an AlN substrate having dispersed thereon BN particles, but in this Example, an AlN crystal-containing thermally conductive and electrically insulating material is produced using an AlN substrate on which BN particles are not dispersed. Also, in this Example, metallic magnesium is disposed in the heating furnace, and an AlN crystal is formed on the AlN substrate by evaporating at least a part of the metallic magnesium into the atmosphere in the heating furnace.

Figure 29A:
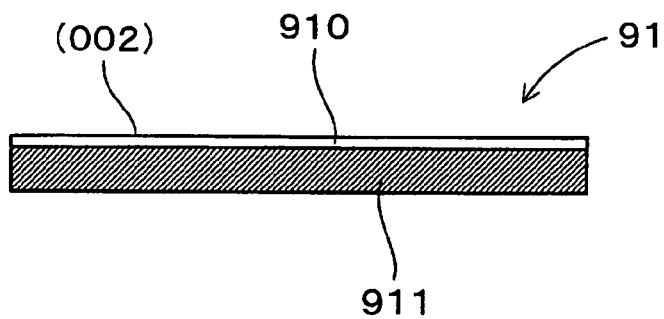
FIG. 29(a) shows an explanatory view illustrating the cross-sectional construction of the AlN substrate, according to Example 4.

In this Example, as shown in FIG. 29(a), an AlN substrate 91 having an Si substrate 911 and an AlN coat layer 910 formed on the Si Substrate 911 was first produced.

Specifically, an AlN coat layer 910 comprising AlN and having a thickness of about 1 μm was formed on a 0.6 mm-thick Si substrate 911 by sputtering.

In the sputtering, an aluminum sheet is disposed as a target in a vacuum chamber (degree of vacuum: from 0.0001 to 0.01 Pa, temperature: from room temperature to 200° C.), and a plasma is generated by applying a high voltage. When nitrogen bombards the aluminum sheet, aluminum is ejected from the aluminum sheet and at the same time, AlN is produced and reaches the Si substrate surface to form the above-described AlN coat layer. In this way, an AlN substrate 91 where, as shown in FIG. 29(a), an AlN coat layer 910 was formed on an Si substrate 911 was obtained.

Figure 31:
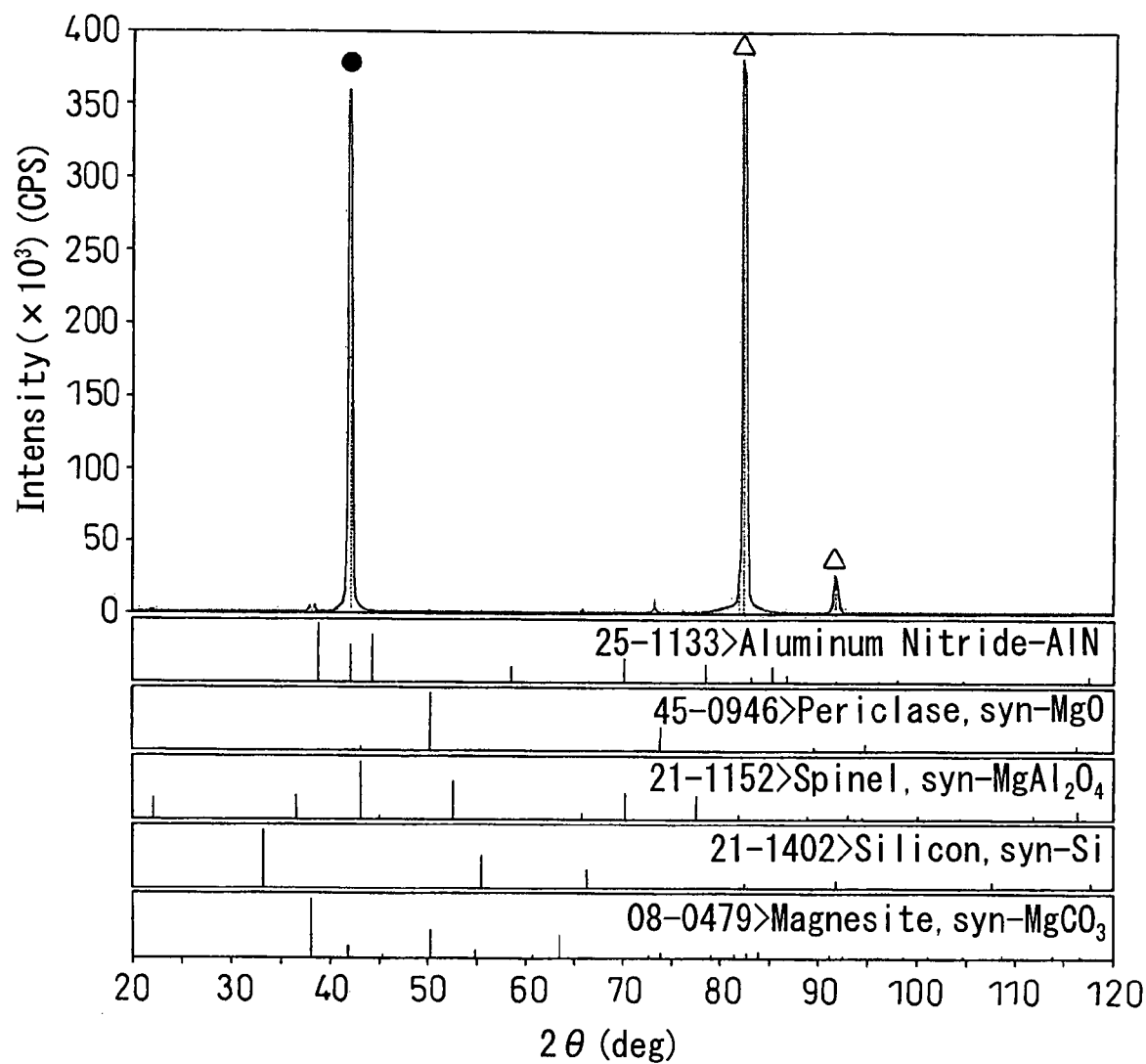
FIG. 31 shows an explanatory view illustrating the XRD diffraction pattern of the AlN coat layer formed on the AlN substrate by sputtering according to Example 4.

The AlN coat layer 910 of the thus-obtained AlN substrate 91 was subjected to X-ray diffraction measurement (XRD, θ-2θ method) using a CuKα ray. FIG. 31 shows the results obtained (XRD pattern). In the Figure, XRD patterns of AlN, MgO (periclase), $MgAl_2O_4$ (spinel), Si (silicon) and $MgCO_3$ (magnesite), registered in JCPDS card, are shown together for reference.

As seen from FIG. 31, the AlN coat layer 910 of the AlN substrate 91 of this Examples has a peak • (filled circle) derived from AlN and it is revealed that AlN is formed. Also, as regards the surface where a molten aluminum layer described later is formed, the AlN coat layer 910 has a distinct peak at the position of 2θ=about 42°. This peak is a peak derived from the (002) plane of the AlN crystal structure and therefore, it is understood that a (002) plane is mainly oriented on the molten aluminum layer-forming surface of the AlN coat layer 910. Also, relatively strong peaks Δ (triangle) appear at the positions of 2θ=about 83° and 2θ=about 92°, and these are a peak derived from Si of the Si substrate 911.

Figure 30:
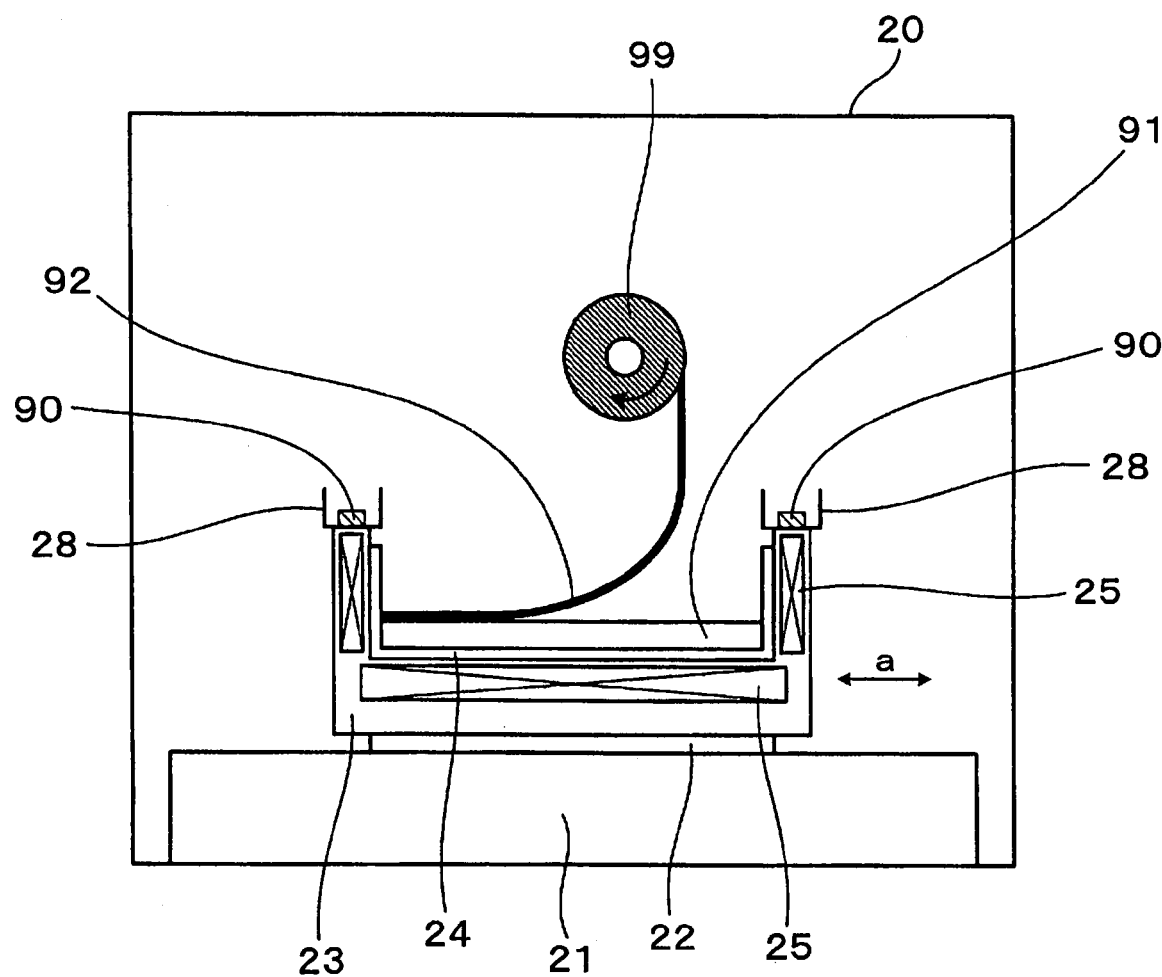
FIG. 30 shows an explanatory view illustrating the construction of the heating furnace according to Example 4.

Then, as shown in FIG. 30, a heating furnace 20 was prepared.

The heating furnace 20 of this Example has almost the same construction as the heating furnace of Example 1. In other words, the heating furnace 20 comprises, as shown in FIG. 30, a pedestal 21 having built into the bottom thereof a movable device (not shown). A movable part 22 of the movable device protrudes from the pedestal 21, and a movable pedestal 23 concaved in cross-section is connected to the movable part 22. The movable pedestal 23 can be parallelly moved in the direction of the arrow a in the Figure as well as in the direction perpendicular to the arrow a. In the movable pedestal 23, a crucible 24 for disposing the AlN substrate 91 therein is disposed. A heater 25 is embedded in the bottom and outer wall of the deep dish-like movable pedestal 23 and can heat the AlN substrate 91 disposed in the crucible 24.

Also, an aluminum roll 99 obtained by winding a 0.018 mm-thick aluminum sheet (aluminum foil) 92 around a roll is disposed above the movable pedestal 23.

The heating furnace 20 of this Example has an Mg rack 28 for disposing metallic magnesium 90 therein at the projected portion of the movable pedestal 23 concaved in cross-section, and a pellet-like metallic magnesium 90 is disposed in the Mg rack 28. The metallic magnesium 90 disposed in the Mg rack 28 is heated by the heater 25 embedded in the movable pedestal 23.

The AlN substrate 91 produced above in this Example was disposed in the crucible 24 on the movable pedestal 23 in the heating furnace 20, and the inside of the heating furnace 20 was then vacuumized to create a nearly vacuum state of about 0.001 to 0.1 Pa in the heating furnace 20. Furthermore, an $N_2$ gas was introduced into the heating furnace 20, and the pressure in the heating furnace 20 was set to about 0.1 MPa.

Thereafter, in a similar manner to Example 1, the heater 25 was actuated to heat the AlN substrate 91 disposed in the crucible 23 to a temperature of 900° C., the aluminum roll 99 was rotated to allow the aluminum sheet 92 to hang down, and the aluminum sheet 92 was disposed on the AlN substrate 91. At this time, the aluminum sheet 92 was disposed to lie from one end part toward another end part on the AlN substrate 91 by parallelly moving the movable pedestal 23. As shown in FIG. 30, the aluminum sheet 92 continuing to the aluminum roll 99 was separated from the aluminum roll 99 as a result of melting of the aluminum sheet 92 disposed on the AlN substrate 91.

Figure 29B:
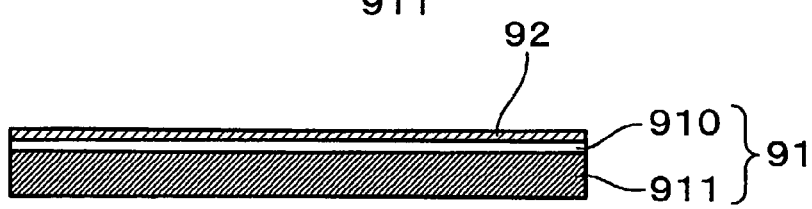
FIG. 29(b) shows an explanatory view illustrating the cross-sectional structure in the state of an aluminum sheet being dispersed on the AlN substrate, according to Example 4.
Figure 29C:
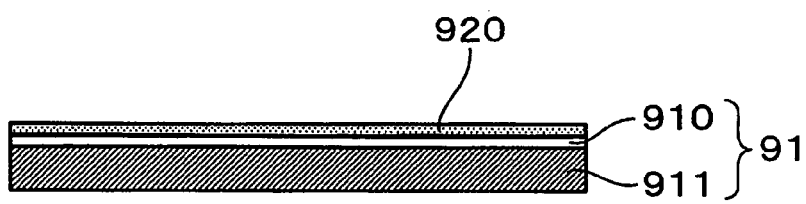
FIG. 29(c) shows an explanatory view illustrating the cross-sectional structure in the state of a molten aluminum layer being formed on the AlN substrate, according to Example 4.

In this way, the aluminum sheet 92 was disposed on the AlN coat layer 910 of the AlN substrate 91 (see, FIG. 29(b)), and the aluminum sheet 92 disposed on the AlN substrate 91 was melted by the heat of the heated AlN substrate 91 to form, as shown in FIG. 29(c), a molten aluminum layer 920 on the AlN substrate 91.

Here, at the operation of the heater 25, as shown in FIG. 30, the metallic magnesium 90 disposed in the Mg rack 28 is also heated, and a part of the heated metallic magnesium 90 is melted, vaporized and dispersed into the atmosphere of $N_2$ gas in the heating furnace 20. The Mg dispersed into the atmosphere gas in the heating furnace 20 can remove oxygen from the oxide layer comprising alumina formed, for example, on the surface of the aluminum sheet 92, as a result, the surface of the aluminum sheet 92 is activated and the reaction of the aluminum sheet 92 with an $N_2$ gas, which is described later, is accelerated.

Figure 29D:
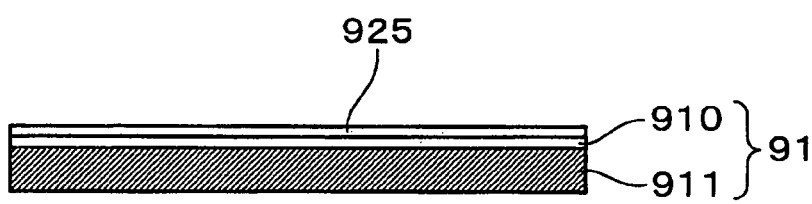
FIG. 29(d) shows an explanatory view illustrating the cross-sectional structure in the state of an AlN layer being formed on the AlN substrate, according to Example 4.

Subsequently, as shown in FIG. 29(c) and FIG. 30, the molten aluminum layer 920 on the AlN substrate 91 was heated by the hater 25 at a temperature of 900° C. for 2 hours, as a result, the molten aluminum layer 920 reacted with the $N_2$ gas in the heating furnace 20 to form, as shown in FIG. 29(d), an AlN layer 925 mainly comprising AlN on the AlN substrate 91. In this way, an AlN crystal comprising an AlN layer 925 was produced on the AlN substrate 91.

Figure 29E:
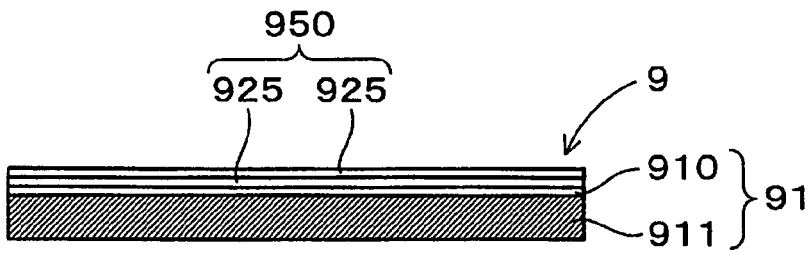
FIG. 29(e) shows an explanatory view illustrating the cross-sectional structure in the state of a plurality of AlN layers being stacked and formed on the AlN substrate, according to Example 4.

Also in this Example, in a similar manner to Example 1, a continuous stacking step of repeating a stacking step of again forming a molten aluminum layer on the formed AlN layer and heating the molten aluminum layer in an atmosphere of $N_2$ gas to stack and form an AlN layer mainly comprising AlN was performed. In this way, an AlN crystal 950 having a thickness of about 10 μm where, as shown in FIG. 29(e), a plurality of AlN layers 925 were stacked and formed was produced on the AlN substrate 91 (see, FIG. 29(e)), and a thermally conductive and electrically insulating material 9 containing the AlN crystal 950 was obtained.

The cross-section of the thus-obtained thermally conductive and electrically insulating material was observed through a scanning electron microscope (SEM). The observation results are shown in FIG. 32 (SEM photograph) and FIG. 33 (schematic view of FIG. 32).

Figure 32:
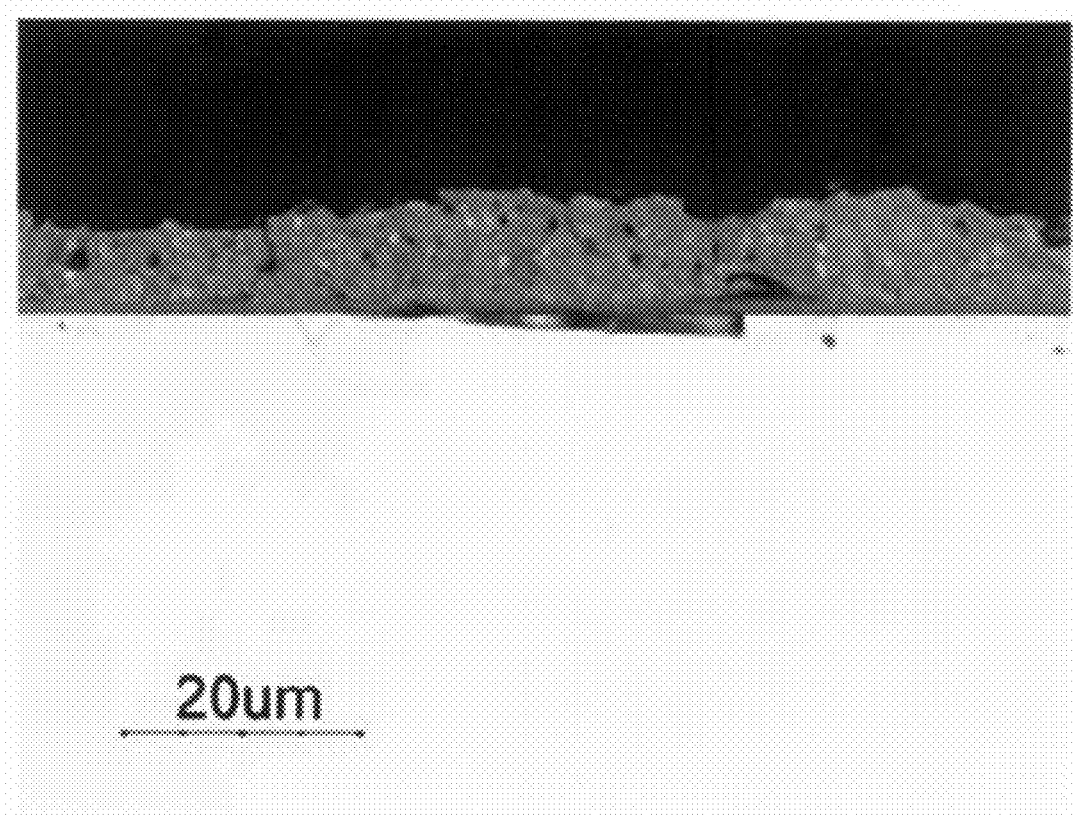
FIG. 32 shows an explanatory view illustrating the cross-sectional SEM photograph of the thermally conductive and electrically insulating material comprising an AlN substrate and an AlN crystal formed thereon according to Example 4.
Figure 33:
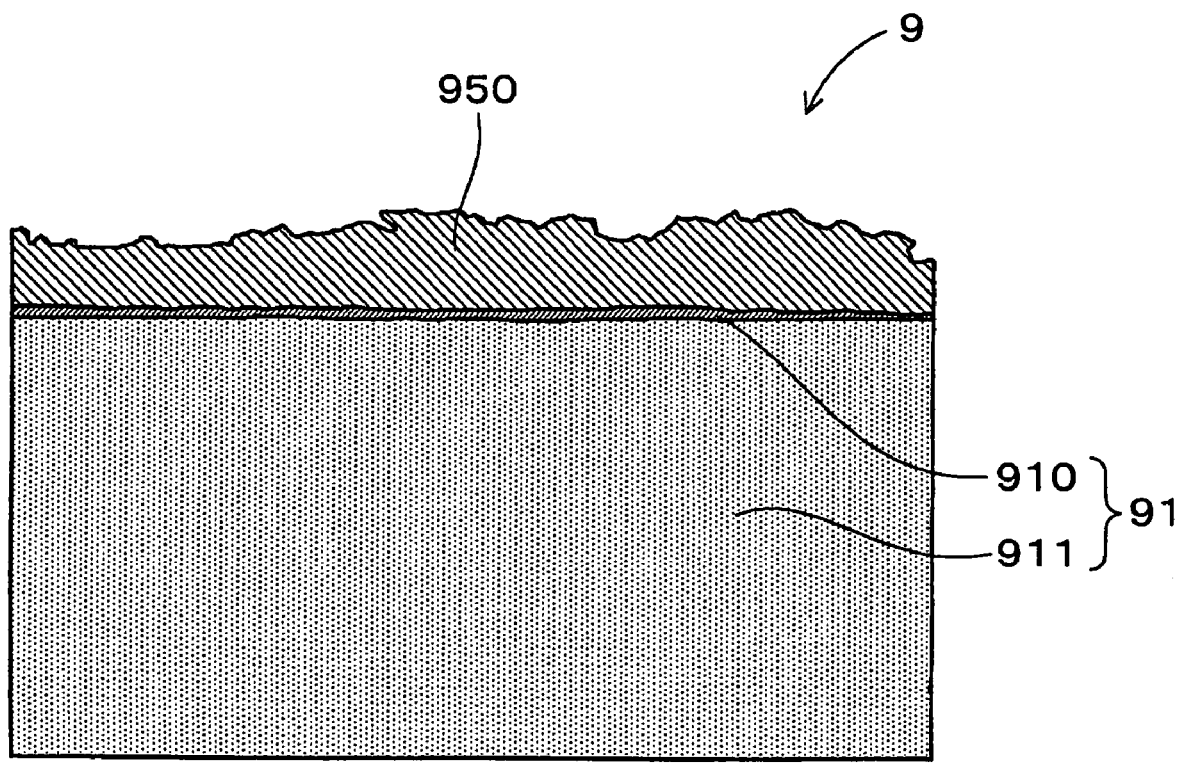
FIG. 33 shows an explanatory view illustrating the cross-sectional structure of the thermally conductive and electrically insulating material comprising an AlN substrate and an AlN crystal formed thereon according to Example 4 (schematic view of FIG. 32).

As seen from FIGS. 32 and 33, in the thermally conductive and electrically insulating material 9 produced in this Example, an AlN crystal 950 is formed on the AlN substrate 91 having an Si substrate 911 and an AlN coat layer 910 formed thereon. The AlN crystal 950 is formed on the 1 μm-thick AlN coat layer 910 formed at the top of the AlN substrate 91.

Figure 34:
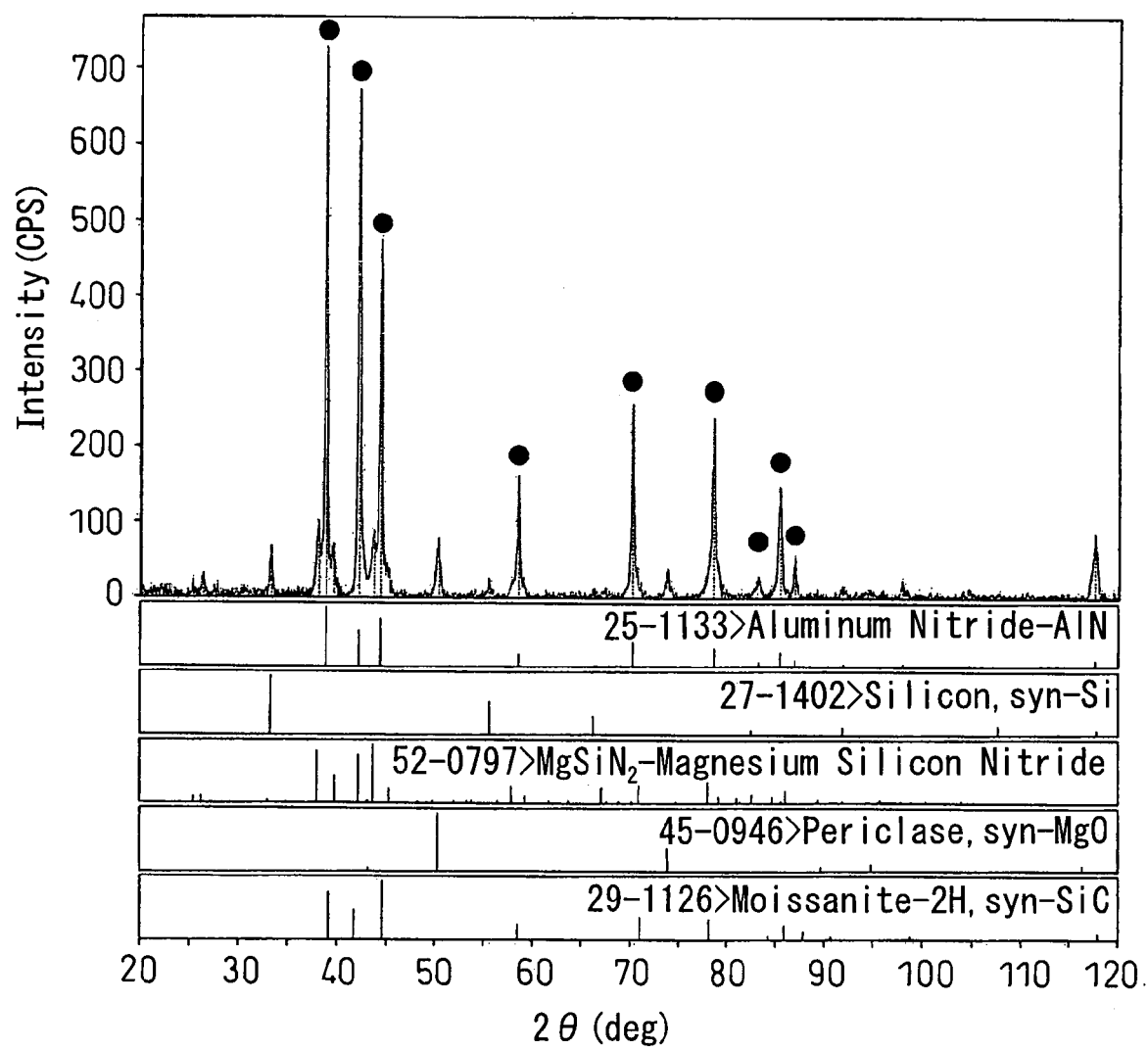
FIG. 34 shows an explanatory view illustrating the XRD diffraction pattern of the AlN crystal formed on the AlN substrate according to Example 4.

The AlN crystal of the thermally conductive and electrically insulating material of this Example was subjected to X-ray diffraction measurement (XRD, θ-2θ method) using CuKα ray. FIG. 34 shows the results obtained (XRD pattern). In the Figure, XRD patterns of AlN, Si (silicon), $MgSiN_2$, MgO (periclase) and SiC (moissanite), registered in JCPDS card, are shown together for reference. In the Figure, the numeral appended to the left of each substance name (chemical formula) is the registered number of JCPDS card.

As seen from FIG. 34, the AlN crystal of the thermally conductive and electrically insulating material of this Example has a peak • (filled circle)) derived from AlN and it is revealed that AlN is formed. Also, the AlN crystal has a relatively distinct peak at the position of 2θ=about 42°. This peak is a peak derived from the (002) plane of the AlN crystal structure and therefore, it is understood that a (002) plane is mainly oriented in the AlN crystal 950. As described above, since a (002) plane is mainly oriented also in the AlN coat layer on the AlN substrate, the AlN crystal is considered to have grown by inheriting the crystal orientation of the AlN coat.

Also, the AlN crystal has a peak derived from MgO. This is considered to appear because Mg dispersed in the heating furnace deprived alumina of oxygen and MgO produced was detected in the AlN crystal.

In this way, according to this Example, an AlN crystal-containing thermally conductive and electrically insulating material can be produced even by using an AlN substrate on which BN particles are not dispersed. Furthermore, by disposing metallic magnesium in the heating furnace, formation of the AlN crystal can be accelerated.

Example 5

In this Example, a thermally conductive and electrically insulating material is produced using an aluminum sheet comprising an aluminum alloy.

Specifically, in this Example, an AlN substrate where an AlN coat layer is formed on a Si substrate was first produced (see, FIG. 29(a)) in the same manner as in Example 4.

Subsequently, using a heating furnace having the same construction as that in Example 1, the aluminum sheet was melted on the AlN substrate to form a molten aluminum layer, and the molten aluminum layer was reacted with an $N_2$ gas to produce an AlN crystal. In this Example, an aluminum ally (5NO2 material) was used as the aluminum sheet.

In other words, in this Example, an AlN crystal was produced using the same heating furnace as in Example 1 in the same manner as in Example 4 except that an aluminum sheet comprising an aluminum alloy was used in place of disposing metallic magnesium in the heating furnace.

In this case, magnesium contained in the aluminum alloy is liquefied in the vicinity of the melting point of aluminum and vaporized. At this time, oxygen can be removed from the oxide on the aluminum sheet surface. Therefore, when the molten aluminum layer and the $N_2$ gas are reacted to produce AlN, the reactivity can be enhanced.

In this way, when a molten aluminum layer is formed by using an aluminum alloy in the molten aluminum layer-forming step, formation of the AlN crystal can be accelerated.

We claim:

1. A method for producing a thermally conductive and electrically insulating material containing an aluminum nitride (AlN) crystal which comprises an AlN layer mainly comprising AlN, wherein the method comprising:

a molten aluminum layer-forming step of forming a molten aluminum layer having a uniform thickness on an AlN substrate with at least a surface thereof comprising AlN in an atmosphere of non-oxidizing gas, by dropping molten aluminum droplets on said AlN substrate and also arraying said droplets on said AlN substrate, and a reaction step of heating said molten aluminum layer in an atmosphere of $N_2$ gas to form an AlN crystal which comprises an AlN layer mainly comprising AlN.

2. The method for producing a thermally conductive and electrically insulating material according to claim 1, wherein said atmosphere of non-oxidizing gas is an atmosphere of $N_2$ gas.

3. The method for producing a thermally conductive and electrically insulating material according to claim 1, wherein said molten aluminum layer-forming step and said reaction step are performed in a heating furnace.

4. The method for producing a thermally conductive and electrically insulating material according to claim 1, wherein said AlN substrate has boron nitride (BN) particles dispersed at least on the surface where said molten aluminum layer is formed.

5. The method for producing a thermally conductive and electrically insulating material according to claim 1, wherein in said reaction step, said AlN substrate is heated at a temperature of 650 to 1,500° C.

6. The method for producing a thermally conductive and electrically insulating material according to claim 1, which further comprises a continuous stacking step of repeating once or more a stacking step of forming a molten aluminum layer on the formed AlN layer in an atmosphere of non-oxidizing gas, and heating said molten aluminum layer in an atmosphere of $N_2$ gas to stack and form an AlN layer mainly comprising AlN.

7. The method for producing a thermally conductive and electrically insulating material according to claim 1, which further comprises a removing step of removing said AlN substrate from said AlN crystal.

8. The method for producing a thermally conductive and electrically insulating material according to claim 1, wherein said AlN substrate comprises a Cu substrate mainly comprising Cu and an AlN coat layer mainly comprising AlN formed on said Cu substrate.

9. A method for producing a thermally conductive and electrically insulating material comprising an AlN crystal which comprises an AlN layer mainly comprising AlN, and an Al gradient layer which contains Al and AlN and is formed on said AlN crystal and in which the Al concentration increases with distance from said AlN crystal in the stacking direction, the method comprising:

a molten aluminum layer-forming step of forming a molten aluminum layer on an AlN substrate with at least a surface thereof comprising AlN in an atmosphere of non-oxidizing gas, a reaction step of heating said molten aluminum layer in an atmosphere of $N_2$ gas to form an AlN crystal which comprises an AlN layer mainly comprising AlN, and a gradient step of forming said Al gradient layer, in which the Al concentration increases with a distance from said AlN crystal in a stacking direction, by repeating at least twice or more a heating step of forming a molten aluminum layer on the formed AlN layer in an atmosphere of non-oxidizing gas, and heating said molten aluminum layer in an atmosphere of $N_2$ gas, and also by decreasing the amount of the $N_2$ gas dissolved in said molten aluminum layer as said heating step is repeated.

10. The method for producing a gradient thermally conductive and electrically insulating material according to claim 9, wherein said atmosphere of non-oxidizing gas is an atmosphere of $N_2$ gas.

11. The method for producing a thermally conductive and electrically insulating material according to claim 9, wherein in said molten aluminum layer-forming step, said molten aluminum layer is formed by dropping a molten aluminum droplet on said AlN substrate, and also arraying said droplets on said AlN substrate.

12. The method for producing a thermally conductive and electrically insulating material according to claim 9, wherein in said molten aluminum layer-forming step, said molten aluminum layer is formed by disposing an aluminum sheet on said AlN substrate, and melting said aluminum sheet.

13. The method for producing a thermally conductive and electrically insulating material according to claim 9, wherein in said heating step, said molten aluminum layer is formed by dropping a molten aluminum droplet on said AlN layer, and also arraying said droplets on said AlN layer.

14. The method for producing a thermally conductive and electrically insulating material according to claim 9, wherein in said heating step, said molten aluminum layer is formed by disposing an aluminum sheet on said AlN layer, and melting said aluminum sheet.

15. The method for producing a thermally conductive and electrically insulating material according to claim 9, wherein said molten aluminum layer-forming step, said reaction step and said heating step are performed in a heating furnace.

16. The method for producing a thermally conductive and electrically insulating material according to claim 9, wherein in said reaction step and said heating step, said AlN substrate is heated at a temperature of 650 to 1,500° C.

17. The method for producing a thermally conductive and electrically insulating material according to claim 9, which further comprises an Al layer-forming step of forming an Al layer comprising Al on the outermost layer of said Al gradient layer.

18. The method for producing a thermally conductive and electrically insulating material according to claim 9, wherein between said reaction step and said gradient step, further comprising a continuous stacking step of repeating at least once or more a stacking step of forming a molten aluminum layer on the formed AlN layer in an atmosphere of non-oxidizing gas, and heating said molten aluminum layer in an atmosphere of $N_2$ gas to stack and form an AlN layer mainly comprising AlN.

19. The method for producing a thermally conductive and electrically insulating material according to claim 9, wherein said AlN substrate has BN particles dispersed at least on the surface where said molten aluminum layer is formed.

20. The method for producing a thermally conductive and electrically insulating material according to claim 9, which further comprises a removing step of removing said AlN substrate from said AlN crystal.

21. The method for producing a thermally conductive and electrically insulating material according to claim 9, wherein said AlN substrate comprises a Cu substrate mainly comprising Cu and an AlN layer mainly comprising AlN formed on said Cu substrate.

* * * * *